US010635138B2

(12) United States Patent
Kim et al.

(10) Patent No.: US 10,635,138 B2
(45) Date of Patent: *Apr. 28, 2020

(54) ELECTRIC SHOCK PROTECTION DEVICE AND PORTABLE ELECTRONIC DEVICE INCLUDING THE SAME

(71) Applicant: AMOTECH CO., LTD., Incheon (KR)

(72) Inventors: Tong Gi Kim, Yongin-si (KR); Jun-Suh Yu, Incheon (KR); Kyu Hwan Park, Yongin-si (KR); Gui Nam Sun, Incheon (KR); Jae Su Ryu, Seoul (KR); Seung Chul Lee, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 269 days.

This patent is subject to a terminal disclaimer.

(21) Appl. No.: 15/605,732

(22) Filed: May 25, 2017

(65) Prior Publication Data

US 2017/0262024 A1    Sep. 14, 2017

Related U.S. Application Data

(63) Continuation of application No. 14/885,326, filed on Oct. 16, 2015, now Pat. No. 9,703,326.

(30) Foreign Application Priority Data

Nov. 20, 2014  (KR) .................. 10-2014-0162858
May 18, 2015   (KR) .................. 10-2015-0069286
Jul. 1, 2015    (KR) .................. 10-2015-0094273

(51) Int. Cl.
*G06F 1/16* (2006.01)
*H04M 1/02* (2006.01)
(Continued)

(52) U.S. Cl.
CPC ............ *G06F 1/1656* (2013.01); *H04M 1/02* (2013.01); *H04M 1/026* (2013.01);
(Continued)

(58) Field of Classification Search
CPC .......... H04M 1/06; H04M 1/026; H04M 1/02; G06F 1/1656; H02H 9/046; H05K 1/0259; H01L 27/0288
(Continued)

(56) References Cited

U.S. PATENT DOCUMENTS

2012/0300355 A1   11/2012   Umeda et al.

FOREIGN PATENT DOCUMENTS

JP    2003257781 A    9/2003
JP    2005505188 A    2/2005
(Continued)

OTHER PUBLICATIONS

Machine translation of Shimabara Japanese Patent Document JP 2003-257781 A Sep. 12, 2003 (Year: 2003).*
(Continued)

*Primary Examiner* — Kevin J Comber
(74) *Attorney, Agent, or Firm* — Seed Intellectual Property Law Group LLP

(57) ABSTRACT

Provided is an electric shock protection device disposed between a human body contactable conductor and an internal circuit unit of an electronic device. The electric shock protection device includes: a sintered body where a plurality of sheet layers stacked; an electric shock protection unit including at least one pair of inner electrodes disposed spaced a predetermined interval apart from each other inside the sintered body and a pore disposed between the inner electrodes; and at least one capacitor layer configured to pass communication signals flowing from the conductor.

23 Claims, 31 Drawing Sheets

(51) Int. Cl.
*H02H 9/04* (2006.01)
*H05K 1/02* (2006.01)
*H01L 27/02* (2006.01)

(52) U.S. Cl.
CPC ......... *H01L 27/0288* (2013.01); *H02H 9/046* (2013.01); *H05K 1/0259* (2013.01)

(58) Field of Classification Search
USPC .......................................................... 361/51
See application file for complete search history.

(56) References Cited

FOREIGN PATENT DOCUMENTS

| | | | |
|---|---|---|---|
| JP | 2010146779 | A | 7/2010 |
| KR | 100573364 | B1 | 4/2006 |
| KR | 100630187 | B1 | 9/2006 |
| KR | 10-2008-0044551 | A | 5/2008 |
| KR | 10-2008-0067917 | A | 7/2008 |
| KR | 101012965 | B1 | 2/2011 |

OTHER PUBLICATIONS

Kim et al., "Electric Shock Protection Device and Portable Electronic Device Including the Same," Office Action dated Nov. 28, 2016, for U.S. Appl. No. 14/885,326, 7 pages.

Kim et al., "Electric Shock Protection Device and Portable Electronic Device Including the Same," Response filed Jan. 24, 2017, for U.S. Appl. No. 14/885,326, 3 pages.

\* cited by examiner

ELECTRIC SHOCK PROTECTION DEVICE AND PORTABLE ELECTRONIC DEVICE INCLUDING THE SAME

BACKGROUND OF THE INVENTION

The present invention disclosed herein relates to an electric shock protection device and a portable electronic device including the same, and more particularly, to an electric shock protection device for protecting a user from leakage current due to power, protecting an internal circuit from external electrostatic, and minimizing the attenuation of communication signals and delivering them, and a portable electronic device including the same.

Recent portable electronic devices employ housings of a metal material increasingly in order to improve the aesthetics and durability.

However, since such housings of a metal material have excellent electrical conductivity due to characteristics of a material, an electrical path may be formed between an external housing and a built-in circuit unit through a specific device or according to a portion. Especially, as a metal housing and a circuit unit forms a loop, when static electricity of a momentarily high voltage flows through a conductor such as a metal housing with a large external exposure area, this may damage a circuit unit such as IC and therefore, measures against this may be required.

On the other hand, such a portable electronic device typically charges its battery by using a charger. Such a charger rectifies external AC power into DC power and then again converts it into low DC power appropriate for a portable electronic device through a transformer. Herein, a Y-CAP configured with a capacitor is provided to both ends of a transformer in order to enhance the electrical insulation of the transformer.

However, if Y-CAP does not have a regular characteristic such as a non-genuine charger, DC power may not be sufficiently block by Y-CAP and furthermore, leakage current may occur by AC power. Additionally, such leakage current may be spread along the ground part of circuit.

Since such leakage current can be delivered to a human body contactable conductor such as an external case of a portable electronic device, this may provide discomfort painful feeling to a user and in severe cases, a user may get fatal injuries due to electric shock.

Accordingly, a portable electronic device such as a mobile phone employing a metal case may require an effective plan to protect a user from such leakage current.

Moreover, in such a way, a portable electronic device including a housing of a metal material includes a plurality of antennas by each function according to the multi-functionalization. At least part of antennas may be disposed at an external housing of a portable electronic device as a built-in antenna or a metal housing itself may be used as an antenna.

In such a case, an antenna and an internal circuit of a portable electronic device are required to be connected to each other and at this point, communication signals are required to be smoothly delivered to the internal circuit without attenuation.

However, as mentioned above, if a capacitance of a corresponding device is increased to effectively deliver communication signals, dielectric breakdown may be caused by external static electricity and accordingly, a corresponding device may be damaged.

Furthermore, as mentioned above, the implementation of a high breakdown voltage for blocking leakage current by external power and the implementation of a high-capacity capacitance for delivering communication signals may not be achieved due to their opposite effects. Accordingly, a scheme for protecting a user from static electricity, blocking leakage current, and implementing a high capacitance is required.

SUMMARY OF THE INVENTION

An object of the present invention is to provide an electric shock protection device for protecting an internal circuit and/or a user from leakage current due to static electricity or external power and minimizing the attenuation of communication signal to deliver it and a portable electronic device including the same.

According to an embodiment of the present invention, there is provided an electric shock protection device disposed between a human body contactable conductor and an internal circuit unit of an electronic device. The electric shock protection device includes: a sintered body where a plurality of sheet layers stacked; an electric shock protection unit including at least one pair of inner electrodes disposed spaced a predetermined interval apart from each other inside the sintered body and a pore disposed between the inner electrodes; and at least one capacitor layer configured to pass communication signals flowing from the conductor, wherein in order to pass static electricity without causing dielectric breakdown when the static electricity flows from the conductor, block a leakage current of an external power source flowing from a ground of the circuit unit, and pass communication signals flowing from the conductor, the following equation is satisfied:

$$Vbr > Vin$$

where Vbr is a breakdown voltage of the electric shock protection unit and Vin is a rated voltage of an external power source of the electronic device.

The rated voltage may be a country-specific standard rated voltage.

Vcp>Vbr where Vcp is a dielectric breakdown voltage of the capacitor layer.

The communication signals may have a wireless communication frequency band.

The capacitor layer may be electrically connected in parallel to the electric shock protection unit.

An interval between the capacitor layer and the electric shock protection unit may be greater than an interval between the pair of inner electrodes of the electric shock protection unit.

An interval between the capacitor layer and the electric shock protection unit may be 15 μm to 100 μm.

A thickness of a capacitor electrode of the capacitor layer may be 2 μm to 10 μm.

An interval between capacitor electrodes of the capacitor layer may be 15 μm to 100 μm.

The sintered body may be formed of an insulator having permittivity.

At least part of the plurality of sheet layers may be formed of a first ceramic material; the remaining sheet layers may be formed of a second ceramic material; and the first ceramic material and the second ceramic material may be different kinds of ceramic materials.

The ceramic material may be a metal-oxide compound and the metal-oxide compound includes at least one selected from $Er_2O_3$, $Dy_2O_3$, $Ho_2O_3$, $V_2O_5$, $CoO$, $MoO_3$, $SnO_2$, $BaTiO_3$, and $Nd_2O_3$.

The ceramic material may be Low Temperature Co-fired Ceramics (LTCC) or High Temperature Co-fired Ceramics (HTCC).

The ceramic material may be ferrite.

The pair of inner electrodes may be disposed on the same plane.

The pore may have a width that is equal to or greater than an interval between the pair of inner electrodes and a height that is equal or greater than a thickness of the pair of inner electrodes.

The pore may be disposed vertically or horizontally on the basis of the inner electrode.

The pore may be provided in plurality between the pair of inner electrodes.

The pore may have an inner wall to which a discharging material layer is applied at a predetermined thickness along a height direction.

The discharging material layer may be formed of a non-conductive material including metal particles or a semi-conductor material.

The discharging material may include a first portion applied along the inner wall of the pore, a second portion outwardly extending from an upper end of the first portion, and a third portion outwardly extending from a lower end of the first portion; and the second portion may contact one of the pair of inner electrodes and the third portion may contact the other one of the pair of inner electrodes.

The inner electrode may include at least one component of Ag, Au, Pt, Pd, Ni, and Cu.

The inner electrode may be provided in polygonal form, circular form, elliptical form, spiral form or a combination form thereof.

An interval of the inner electrodes may be 10 µm to 100 µm.

A thickness of the inner electrodes may be 2 µm to 10 µm.

A volume of the pore may be 1% to 15% with respect to a total volume of the electric shock protection device.

A discharge start voltage of the inner electrode by a static electricity may be 1 kV to 15 kV.

According to an embodiment of the present invention, there is provided an electric shock protection device disposed between a human body contactable conductor and an internal circuit unit of an electronic device. the electric shock protection device includes: a sintered body where a plurality of sheet layers stacked; an electric shock protection unit including at least one pair of inner electrodes disposed spaced a predetermined interval apart from each other inside the sintered body and a pore disposed between the inner electrodes; and at least one capacitor layer configured to pass communication signals flowing from the conductor, wherein in order to pass static electricity without causing dielectric breakdown when the static electricity flows from the conductor, block a leakage current of an external power source flowing from a ground of the circuit unit, and pass communication signals flowing from the conductor, the following equation is satisfied:

$$Vbr > Vin$$

where Vbr is a breakdown voltage of the electric shock protection unit and Vin is a rated voltage of an external power source of the electronic device, wherein an interval between the capacitor layer and the electric shock protection unit is greater than an interval between the pair of inner electrodes of the electric shock protection unit or an interval between capacitor electrodes of the capacitor layer; the pair of inner electrodes are disposed to face each other and an overlapping width facing the pair of inner electrodes is less than a width of an overlapping width of the capacitor electrode; a thickness of the pair of inner electrodes is less than a thickness of the capacitor electrode; the sintered body includes at least one of Ti, Zn, Ce, Nd, and Bi; and a discharging material layer applied to the pore includes at least one of Ti, Ni, Zn, Co, Tc, Zr, La, Nd, and Pt.

According to an embodiment of the present invention, there is provided a portable electronic device with an electric shock protection function. The portable electronic device includes: a human body contactable conductor; a circuit unit; and an electric shock protection device disposed between the conductor and the circuit unit, wherein the electric shock protection device includes: a sintered body where a plurality of sheet layers stacked; an electric shock protection unit including at least one pair of inner electrodes disposed spaced a predetermined interval apart from each other inside the sintered body and a pore disposed between the inner electrodes; and at least one capacitor layer configured to pass communication signals flowing from the conductor, wherein in order to pass static electricity without causing dielectric breakdown when the static electricity flows from the conductor, block a leakage current of an external power source flowing from a ground of the circuit unit, and pass communication signals flowing from the conductor, the following equation is satisfied:

$$Vbr > Vin \text{ and } Vcp > Vbr$$

where Vbr is a breakdown voltage of the electric shock protection unit and Vin is a rated voltage of an external power source of the electronic device and Vcp is a dielectric breakdown voltage of the capacitor layer.

The conductor may include at least one of an antenna for communication between the electronic device and an external device, a metal case, and a conductive jewelry.

The metal case may be provided to partially or entirely surround a side part of a housing of the electronic device.

The metal case may be provided to surround a camera that is provided at a front or rear surface of a housing of the electronic device to be exposed to the outside.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
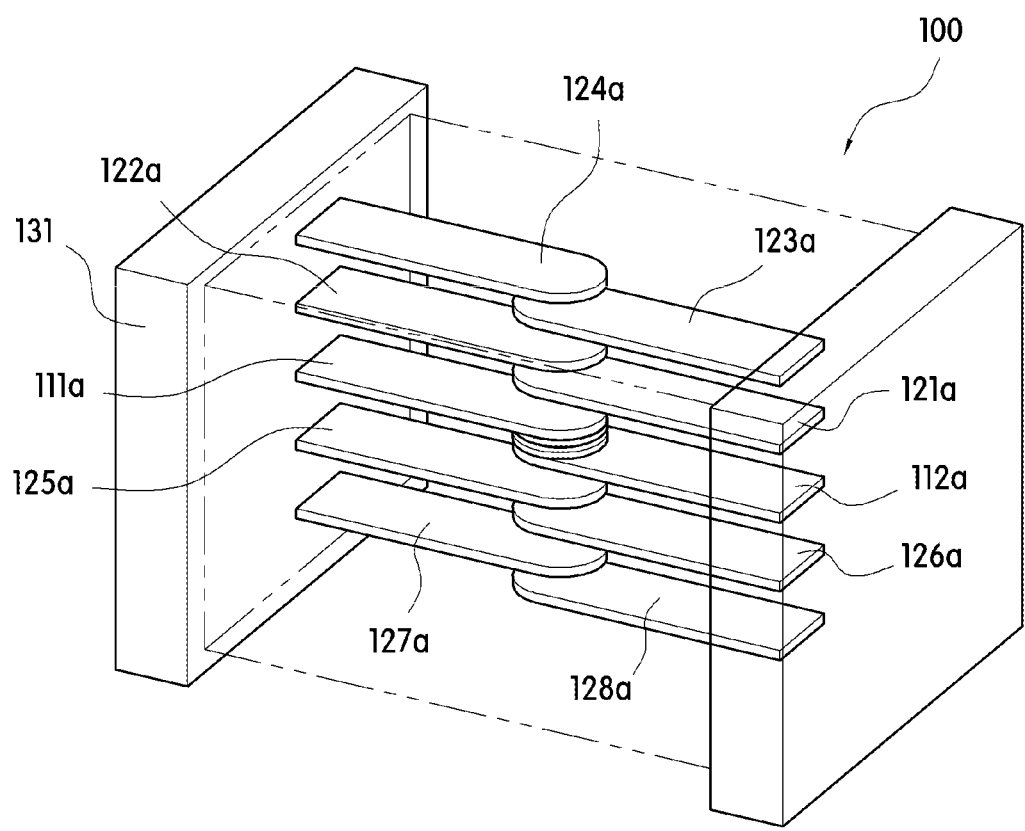
FIG. 1 is an entire perspective view illustrating an electric shock protection device according to an embodiment of the present invention.

Preferred embodiments of the present invention will be described below in more detail with reference to the accompanying drawings. The present invention may, however, be embodied in different forms and should not be constructed as limited to the embodiments set forth herein. Parts not relating to description are omitted in the drawings in order to clearly describe the present invention and like reference numerals refer to like elements throughout.

Figure 2:
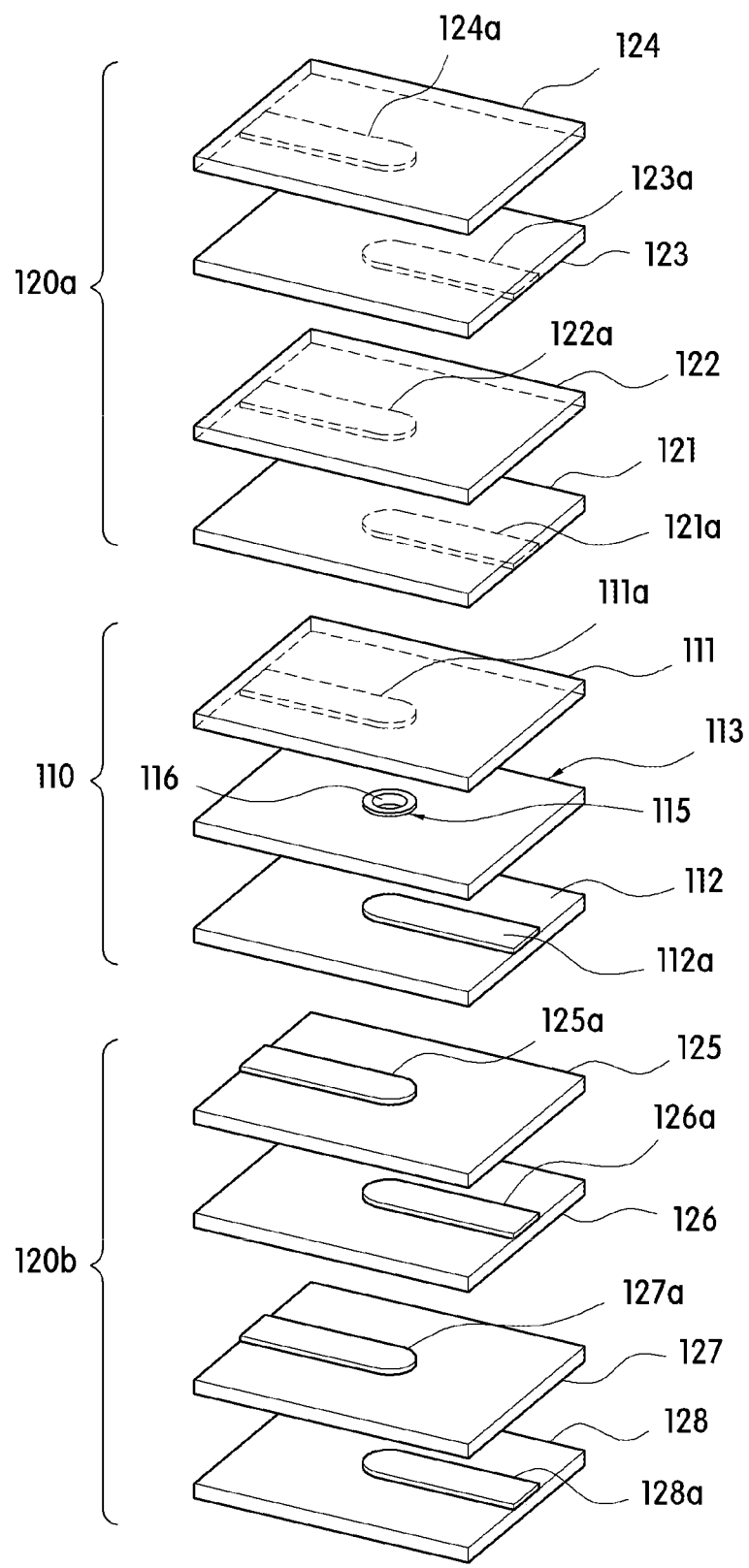
FIG. 2 is an exploded perspective view illustrating a stack relationship of a plurality of sheet layers.
Figure 3:
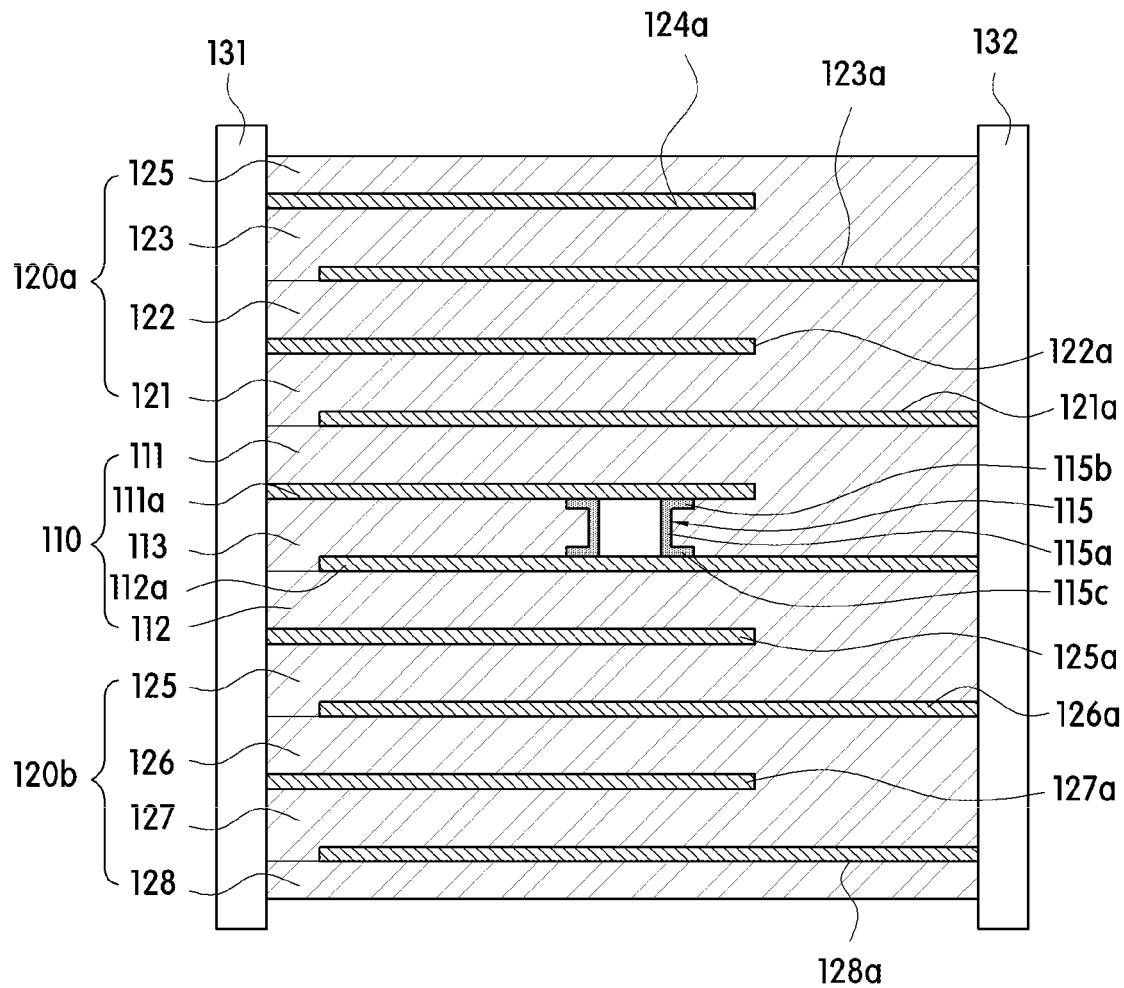
FIG. 3 is a cross-sectional view of FIG. 1.

According to an embodiment of the present invention, an electric shock protection device 100, as shown in FIGS. 1 to 3, includes a sintered body, an electric shock protection unit 110, and capacitor layers 120a and 120b and the electric shock protection unit 110 may be a suppressor.

The electric shock protection device 100 is disposed between a human body contactable conductor and an internal circuit unit of an electronic device, does not cause dielectric breakdown when static electricity flows from the conductor, blocks the leakage current of an external power source flowing from the ground of the circuit unit, and passes communication signals flowing from the conductor. For this, the following conditions may be satisfied:

$$Vbr > Vin, Vcp > Vbr$$

where Vbr is the breakdown voltage of the electric shock protection device, Vin is the rated voltage of the external power of the electronic device, and Vcp is the dielectric breakdown voltage of the capacitor layer.

Herein, the rated voltage may be country-specific standard rated voltage, and for example, may be one of 240V, 110V, 220V, 120V, and 100V.

At this point, in order to configure the electric shock protection unit 110 and the capacitor layers 120a and 120b, after a plurality of sheet layers 111, 112, 113, 121, 122, 123, 124, 125, 126, 127, and 128 that respectively include electrodes 111a, 112a, 121a, 122a, 123a, 115a, 125a, 126a, 127a, and 128a are sequentially stacked on one surface and the plurality of electrodes respectively disposed on one surfaces of the plurality of sheet layers are disposed to face each other, the sintered body is integrally formed through a firing or hardening process.

Such a sintered body may be formed of an insulator having permittivity. For example, the insulator may be formed of ceramic material, Low Temperature Co-fired Ceramics (LTCC), High Temperature Co-fired Ceramics (HTCC), and magnetic material. At this point, the ceramic material may be a metal-oxide compound and the metal-oxide compound may include at least one of $Er_2O_3$, $Dy_2O_3$, $Ho_2O_3$, $V_2O_5$, $COO$, $MoO_3$, $SnO_2$, $BaTiO_3$, and $Nd_2O_3$.

Herein, the inner electrodes 111a and 112a may be formed spaced a predetermined interval apart from each other in the sintered body and may be formed of at least one pair. The first inner electrode 111a and the second inner electrode 112a may be electrically connected to external electrodes 131 and 132 provided at both ends of a sintered body.

The inner electrodes 111a and 112a may include at least one of Ag, Au, Pt, Pd, Ni, and Cu and the external electrodes 131 and 132 may include at least one of Ag, Ni, and Sn.

At this point, an interval, areas facing each other, or an overlapping length between the inner electrodes 111a and 112a may be configured to satisfy the breakdown (or trigger voltage) Vbr of the electric shock protection device 100 and an interval between the inner electrodes 111a and 112a may be 10 μm to 100 μm. For example, an interval between the inner electrodes 111a and 112a may be 25 μm.

Herein, when an interval between the inner electrodes 111a and 112a is less than 10 μm, the resistance to static electricity can be more vulnerable. Additionally, when an interval between the inner electrodes 111a and 112a is greater than 100 μm, as a discharge start voltage (for example, an operating voltage) of the inner electrodes is increased, smooth discharge does not occur due to static electricity so that a protection function to static electricity can be lost.

At this point, a thickness of the first inner electrode 111a and the second inner electrode 112a may be 2 μm to 10 μm. Herein, when a thickness of the first inner electrode 111a and the second inner electrode 112a is less than 2 μm, this may not serve as an inner electrode and when the thickness is greater than 10 μm, securing a distance between inner electrodes is restricted and the volume of the electric shock protection device 100 is increased so that it may have an adverse effect on downsizing.

By such a configuration, a discharge start voltage (for example, an operating voltage) of the inner electrodes 111a and 112a by a static electricity may be 1 kV to 15 kV. Herein, if a discharge start voltage of the electric shock protection device 100 is less than 1 kV, it is difficult to secure the resistance to static resistance and if the discharge start voltage is equal to or greater than 15 kV, it cannot pass static electricity so that the electric shock protection device 100 itself may be damaged by static electricity.

Moreover, a protective sheet layer 113 is disposed between the pair of electrodes 111a and 112a corresponding to each other in order to block static electricity and protect an electric shock protection device and peripheral circuits from overvoltage.

The protective sheet layer 113 includes at least one pore-forming member 115 formed of a hollow type between the pair of inner electrodes 111a and 112a. For this, the protective sheet layer 113 may include a through hole formed at a position at which the pore-forming member 115 is provided.

More specifically, in relation to the sintered body, the first sheet layer 111 including the first inner electrode 111a and the second sheet layer 112 including the second inner electrode 112a are stacked on the top surface and the protective sheet layer 113 is disposed between the first sheet layer 111 and the second sheet layer 112.

That is, the first sheet layer 111, the protective sheet layer 113, and the second sheet layer 112 may be sequentially stacked to allow the first inner electrode 111a and the second inner electrode 112a to face each other.

Accordingly, after the first inner electrode 111a and the second inner electrode 112a are disposed to face each other, they are spaced a predetermined interval apart from each other by the protective sheet layer 113 and the first inner electrode 111a and the second inner electrode 112a are disposed to allow each one side to contact the pore-forming member 115.

Moreover, at least one through hole is formed by penetrating the protective sheet layer 113 disposed between the first sheet layer 111 and the second sheet layer 112 as shown in FIG. 3.

Herein, the through hole is formed to be disposed in an area where the first inner electrode 111a and the second inner electrode 112a, which are disposed vertically, overlap each other on the basis of the protective sheet layer 113.

At this point, the through hole may include the pore-forming member 115. The pore-forming member 115 is disposed between the inner electrodes 111a and 112a and may include discharging material layers 115a, 115b, and 115c applied to the inner wall with a predetermined thickness along a height direction.

Alternatively, if the pore-forming member 115 is not provided additionally, a discharging material layer may be applied to the inner wall of the through hole at a predetermined thickness along a height direction.

Herein, the pore-forming member 115 or the discharging material layer applied thereto may be provided to allow the upper end to contact the second inner electrode 112a and the lower end to contact the first inner electrode 111a.

A pore 126 may be formed between the pair of inner electrodes 111a and 112a by the pore-forming member 115. A static electricity flowing from the outside may be discharged between the inner electrodes 211a and 212a by the pore 216. At this point, electrical resistance between the inner electrodes 111a and 112a may become lower and a voltage difference between both ends of the electric shock protection device 100 may be reduced to less than a predetermined value. Accordingly, the electric shock protection device 100 may pass static electricity without internal damage.

Herein, a discharging material layer configuring the discharging material layers 115a, 115b, and 115c is required to have low permittivity and no conductivity and there should be no short when overvoltage is applied.

For this, the discharging material layer may be formed of a non-conductive material including at least one of metal particles and may be formed of a semiconductor material including SiC or a silicon based component. Furthermore, the discharging material layer may be formed by mixing at least one of a material selected from SiC, carbon, graphite, and ZnO and at least one of a material selected from Ag, Pd, Pt, Au, Cu, Ni, W, and Mo at a predetermined ratio.

As one example, when the first inner electrode 111a and the second inner electrode 112a include an Ag component, the discharging material layer may include a SiC—ZnO based component. A Silicon carbide (SiC) component has excellent thermal stability, excellent stability in oxidizing atmosphere, a predetermined electrical conductivity and thermal conductivity, and low permittivity.

Then, a ZnO component has excellent non-linear resistance characteristics and discharge characteristics.

When SiC and ZnO are used separately, both have conductivity but when they are mixed and a firing process is performed thereon, ZnO is bonded to a SiC particle surface, thereby forming an insulation layer.

Such an insulation layer forms a SiC—ZnO reaction layer on a SiC particle surface as SiC is completely reacted. Accordingly, the insulation layer further provides a high insulation to a discharging material and improves the resistance to static electricity by blocking Ag pass so that when the electric shock protection device 100 is mounted on an electronic component, DC short phenomenon may be resolved.

Herein, although it is described that a SiC—ZnO based component is included as one example of the discharging material, but the present invention is not limited thereto and the discharging material layer may use a non-conductive material including a semiconductor material or a metal particle, which is appropriate for a component configuring the first inner electrode 111a and the second inner electrode 112a.

At this point, the discharging material layers 115a, 115b, and 115c applied to the inner wall of the pore-forming member 115 may include a first portion 115a applied along the inner wall of the pore-forming member 115, a second portion 115b extending from the upper end of the first portion 115a along the top surface of the protective sheet layer 113 to be in contact to face the first inner electrode 111a, and a third portion 115c extending from the lower end of the first portion 115a along the bottom surface of the protective sheet layer 113 to be in contact to face the second inner electrode 112a.

Through this, since the second portion 115b and the third portion 115c are formed as respectively extending from the upper end and the lower end of the pore-forming member 115 in addition to the inner wall of the pore-forming member 115, the discharging material layers 115a, 115b, and 115c may widen a contact area with the first inner electrode 111a and the second inner electrode 112a.

By such a configuration, as part of a component configuring the discharging material layers 115a, 115b, and 115c is vaporized by electrostatic spark, even if part of the discharging material layers 115a, 115b, and 115c is damaged, the discharging material layers 115a, 115b, and 115c may perform their functions so that the resistance to static electricity can be improved.

On the other hand, the protective sheet layer 113 may include a plurality of pore-forming members 115. In such a way, if the number of pore-forming members 115 is increased, as a discharge path of static electricity is increased, the resistance to static electricity can be improved.

It should be clarified that the protective sheet layer 113 disposed between the first sheet layer 111 and the second sheet layer 112 may be provided to have the same area as the first sheet layer 111 and the second sheet layer 112 but may be provided to have an area where the first inner electrode 111a and the second inner electrode 112a corresponding to each other overlap and have an area that is narrower than the first sheet layer 111 and the second sheet layer 112.

The capacitor layers 120a and 120b are used for passing communication signals flowing from the conductor 12 such as an antenna without attenuation and may be electrically connected in parallel to the electric shock protection unit 110. For example, the capacitor layers 120a and 120b may be disposed on at least one or both of the upper part and the lower part of the electric shock protection unit 110.

Herein, each of the capacitor layers 120a and 120b may include a plurality of stacked sheet layers. At this point, a plurality of sheet layers configuring the capacitor layers 120a and 120b may be formed of an insulator with permittivity and preferably may be formed of a ceramic material.

For example, the ceramic material may be formed of a metal-oxide compound including at least one selected from $Er_2O_3$, $Dy_2O_3$, $Ho_2O_3$, $V_2O_5$, $CoO$, $MoO_3$, $SnO_2$, $BaTiO_3$, and $Nd_2O_3$ or may be formed of ferrite and LTCC or HTCC may be used. Furthermore, it should be understood that the ceramic material may include a ZnO based varistor material or any one of a Pr and Bi-based material, and $Er_2O_3$, $Dy_2O_3$, $Ho_2O_3$, $V_2O_5$, $CoO$, $MoO_3$, $SnO_2$, $BaTiO_3$, and $Nd_2O_3$, which are mentioned as a metal-oxide compound, are exemplary, and other types of metal-based oxide compounds not mentioned above may be used.

On the other hand, a capacitor electrode of the capacitor layers 120a and 120b may include at least one component of Ag, Au, Pt, Pd, Ni, and Cu.

At this point, a plurality of capacitor electrodes configuring the capacitor layers 120a and 120b may be provided to allow an interval d1 between the pair of capacitor electrodes facing each other to have a range of 15 μm to 100 μm and for example, an interval of 20 μm (see FIG. 11).

Herein, if an interval between the capacitor electrodes is less than 15 μm, it is difficult to secure a capacitance sufficient for passing communication signals in a wireless communication band without attenuation and if the interval is greater than 100 μm, as securing a distance between capacitor electrodes is restricted, the number of stacked sheet layers including a capacitor electrode is restricted, so that it is difficult to implement a high-capacity capacitor.

At this point, a thickness of each of capacitor electrodes configuring the capacitor layers 120a and 120b may be provided to have a size that is 1/10 to 1/2 of an interval between the pair of capacitor electrodes facing each other.

For example, when an interval between the pair of capacitor electrodes facing each other is 20 μm, a thickness of the capacitor electrode may be provided to have a range of 2 μm to 10 μm. Herein, when the thickness of a capacitor electrode is less than 2 μm, the capacitor electrode may not perform its role and when the thickness of a capacitor electrode is greater than 10 μm, since the thickness of the capacitor electrode becomes thicker, securing a distance between capacitor electrodes for configuring a capacitor layer is restricted within a predetermines size and thus the number of stacked sheet layers is restricted so that it is difficult to implement a high-capacity capacitor.

Moreover, the shortest distance d2 between a free end part not connected to an external electrode among the both end parts of the capacitor electrodes and the external electrodes 131 and 132 is provided to have at least 15 μm and also may be provided to have a distance in a range of 15 μm to 100 μm (see FIG. 11).

In such a way, as including the capacitor layers 120a and 120b, the electric shock protection device 100 may easily provide a capacitance appropriate for the purpose of use in addition to passing static electricity and blocking a leakage current of external power source. That is, unlike a typical method of using an additional component for increasing RF reception sensitivity in addition to a suppressor, a varistor or a Zener diode for protecting an internal circuit from static electricity, by such the capacitor layers 115a and 115b, protection against static electricity may be provided through one electric shock protection device 100 and RF reception sensitivity may be increased.

Figure 4A:
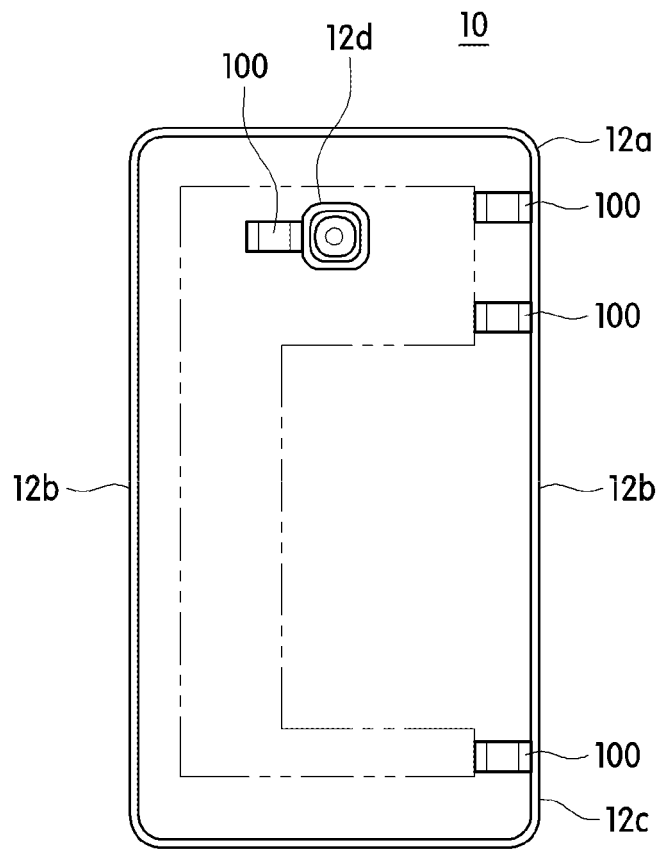
FIGS. 4A to 4E are conceptual diagrams illustrating an application example of an electric shock protection device according to an embodiment of the present invention.

The electric shock protection device 100, as shown in FIG. 4A, may be disposed between the conductor 12 such as an external metal case and the circuit unit 14 in the portable electronic device 10.

Herein, the portable electronic device 10 may be in a form of a portable and easy to carry electronic device. As one example, the portable electronic device may be a portable terminal such as smartphones and cellular phones and may be smart watches, digital cameras, DMB, e-books, netbooks, tablet PCs, and portable computers. Such electronic devices may include any suitable electronic components including antenna structures for communication with an external device. Furthermore, such electronic devices may be devices using short range network communications such as WiFi and Bluetooth.

The portable electronic device 10 may include an external housing formed of conductive materials such as metals (for example, aluminum, stainless steel, etc.), or carbon-fiber composite materials, or materials including other fiber-based composites, glass, ceramic, plastic or combinations thereof.

At this point, the housing of the portable electronic device 10 is formed of metal and include a conductor 12 exposed to the outside. Herein, the conductor 12 may include at least one of antennas, metal cases, and conductive jewelries for communication between the electronic device and an external device.

Especially, the metal case may be provided to partially or entirely surround a side part of the housing of the portable electronic device 10. Additionally, the metal case may be provided to partially or entirely surround a side part of the housing of the portable electronic device 10.

In such a way, the electric shock protection device 100 may be disposed between the human body contactable conductor 12 and the circuit unit 14 of the portable electronic device 10 in order to protect an internal circuit from leakage current and static electricity.

The electric shock protection device 100 may be provided in correspondence to the number of metal cases equipped at the housing of the portable electronic device 10. However, when the metal case is provided in plurality, each of the metal cases 12a, 12b, 12c, and 12d may be built in the housing of the portable electronic device 10 to allow the electric shock protection device 100 to be individually connected thereto.

That is, as shown in FIG. 4A, when the conductor 12 such as a metal case surrounding a side part of the housing of the portable electronic device 10 is divided into three parts, as each of the metal cases 12a, 12b, 12c, and 12d is connected to the electric shock protection device 100, the internal circuit of the portable electronic device 100 may be protected from leakage current and static electricity.

At this point, when the plurality of metal cases 12a, 12b, 12c, and 12d are provided, the electric shock protection device 100 may be provided in various methods to suit a corresponding role of each of the metal cases 12a, 12b, 12c, and 12d.

As one example, in a case that a camera exposed to the outside is provided to the housing of the portable electronic device 10, if the electric shock protection device 10 is applied to a conductor 12d surrounding the camera, the electric shock protection device 100 may be provided in a form of blocking leakage current and protecting an internal circuit from static electricity.

Additionally, when the metal case 12b serves as a ground role, the electric shock protection device 100 is connected to the metal case 12b to be provided in a form of blocking leakage current and protecting an internal circuit from static electricity.

Figure 4B:
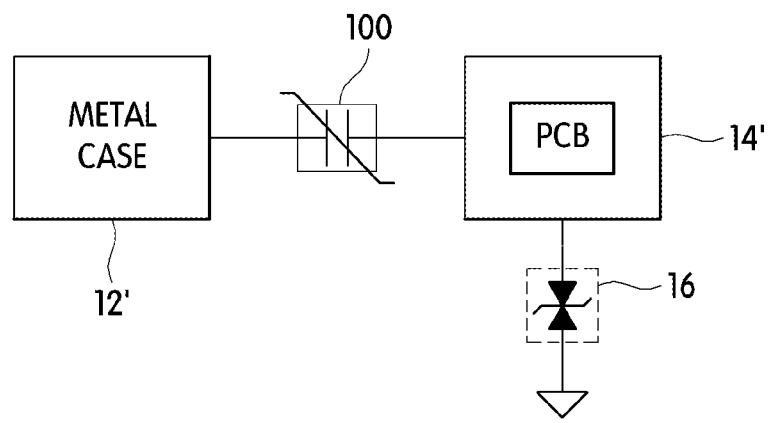

Moreover, as shown in FIG. 4B, the electric shock protection device 100 may be disposed between a metal case 12' and a circuit substrate 14'. At this point, since the electric shock protection device 100 is for passing static electricity without damage to itself, the circuit substrate 14' may include an additional protection device 16 for bypassing static electricity to the ground. Herein, the protection device 16 may be a suppressor or a varistor.

Figure 4C:
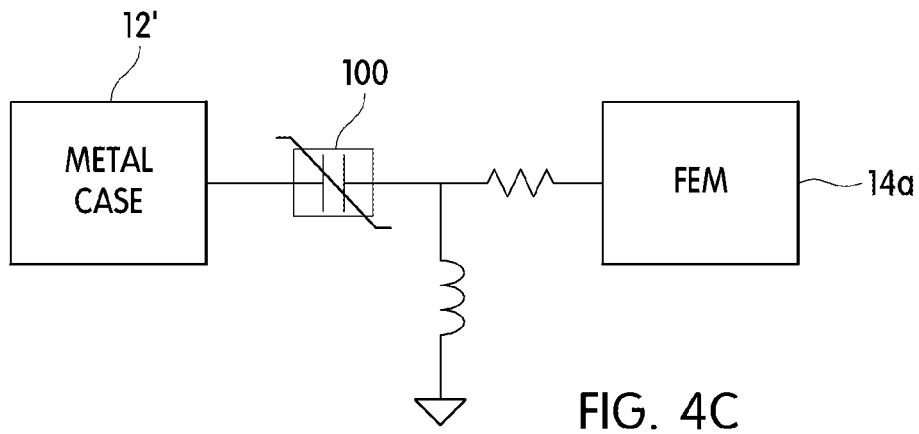

As shown in FIG. 4C, the electric shock protection device 100 may be disposed through a matching circuit (for example, R and L components) between a metal case 12' and a Front End Module (FEM) 14a. Herein, the metal case 12' may be an antenna. At this point, the electric shock protection device 100 passes static electricity from the metal case 12' at the same time when passing communication signals without attenuation and blocks a leakage current flowing from the ground through a matching circuit.

Figure 4D:
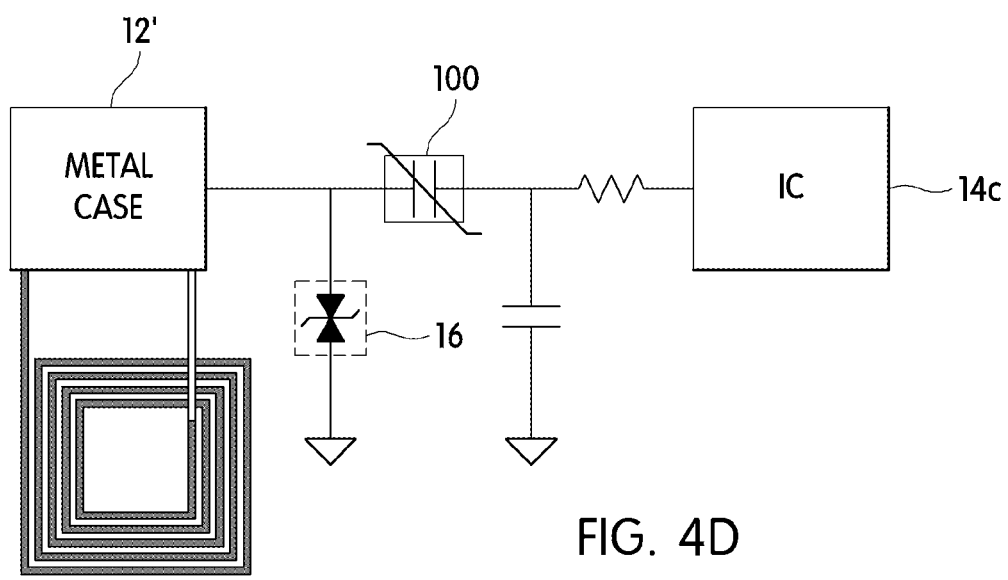

As shown in FIG. 4D, the electric shock protection device 100 may be disposed between the metal case 12' including an antenna and an IC 14c for implementing a communication function through a corresponding antenna. Herein, a corresponding communication function may be NFC communication. At this point, since the electric shock protection device 100 is for passing static electricity without damage to itself, it may include an additional protection device 16 for bypassing static electricity to the ground. Herein, the protection device 16 may be a suppressor or a varistor.

Figure 4E:
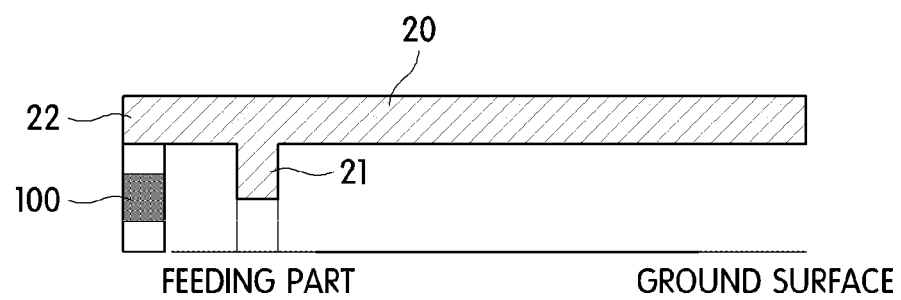

As shown in FIG. 4E, the electric shock protection device 100 may be disposed between a short pin 22 of a Planar Inverted F Antenna (PIFA) and a matching circuit. At this point, the electric shock protection device 100 passes static electricity from the metal case 12' at the same time when passing communication signals without attenuation and blocks a leakage current flowing from the ground through a matching circuit.

Figure 5A:
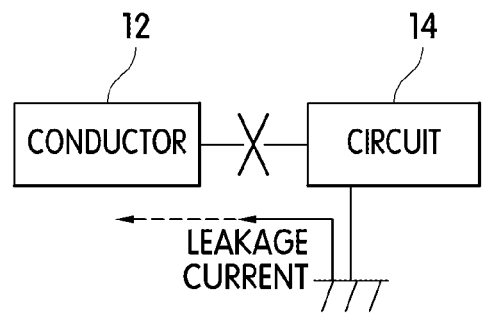
FIG. 5A is schematic equivalent circuit diagrams illustrating operations for leakage current of an electric shock protection device according to an embodiment of the present invention.
Figure 5B:
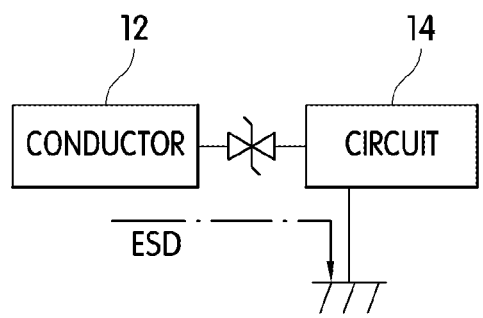
FIG. 5B is schematic equivalent circuit diagrams illustrating operations for electrostatic discharge (ESD) of an electric shock protection device according to an embodiment of the present invention.
Figure 5C:
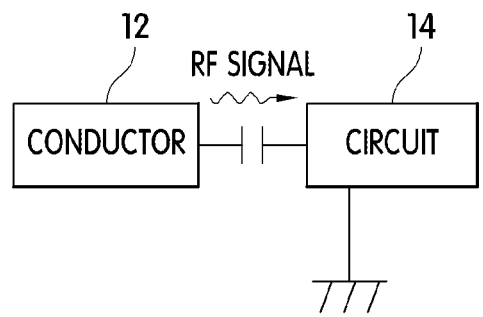
FIG. 5C is schematic equivalent circuit diagrams illustrating operations for communication signals of an electric shock protection device according to an embodiment of the present invention.

The electric shock protection device 100, as shown in FIGS. 5A to 5C, may have different functions according to leakage current by external power source and static electricity flowing from the conductor 12.

That is, as shown in FIG. 5A, when a leakage current of external power source flows into the conductor 12 through a circuit substrate of the circuit unit 14 (for example, the ground), since the breakdown voltage Vbr of the electric shock protection device 100 is high in comparison to overvoltage by leakage current, the electric shock protection device 100 may be maintained in an open state. That is, since the breakdown voltage Vbr of the electric shock protection device 100 is higher than the rated voltage of an external power source of a portable electronic device, the electric shock protection device 100 is not electrically conducted and maintains an open state so that delivering leakage current to the human body contactable conductor 12 such as a metal case can be prevented.

At this point, the capacitor layers 120a and 120b included in the electric shock protection device 100 may block a DC component in leakage current and since the leakage current has a relatively low frequency in comparison to a wireless communication band, it serves as a large impedance with respect to a corresponding frequency so that the leakage current can be blocked.

As a result, the electric shock protection device 100 blocks leakage current in an external power source flowing from the ground of the circuit unit 14, so that a user can be protected from electric shock.

Additionally, as shown in FIG. 5B, when static electricity flows from the outside through the conductor 12, the electric shock protection device 100 may serve as a static electricity protection device such as a suppressor. That is, since an operating voltage (for example, a discharge start voltage) of a suppressor for static electricity discharge is lower than an instantaneous discharge of static electricity, the electric shock protection device 100 may pass static electricity by instantaneous discharge. As a result, since electrical resistance becomes lower when static electricity flows from the conductor 12, the electric shock protection device 100 itself does not cause dielectric breakdown and passes static electricity.

At this point, since the dielectric breakdown voltage Vcp is higher than the breakdown voltage Vbr of the electric shock protection unit 110 in relation to the capacitor layers 120a and 120b in the electric shock protection device 100, static electricity does not flow into the capacitor layers 120a and 120b and is passed to the electric shock protection unit 110.

Herein, the circuit unit 14 may include an additional protection device for bypassing static electricity to the ground. As a result, the electric shock protection device 100 does not cause dielectric breakdown by a static electricity flowing from the conductor 12 and passes static electricity so that it can protect an internal circuit at the rear end.

Additionally, as shown in FIG. 5C, when communication signals flow through the conductor 12, the electric shock protection device 100 may serve as a capacitor. That is, the electric shock protection device 100 may block the conductor 12 and the circuit unit 14 as it is maintained in an open state, but the internal capacitor layers 120a and 120b may pass the flowing communication signals. In such a way, the capacitor layers 120a and 120b of the electric shock protection device 100 may provide a flowing path of communication signals.

Figure 6A:
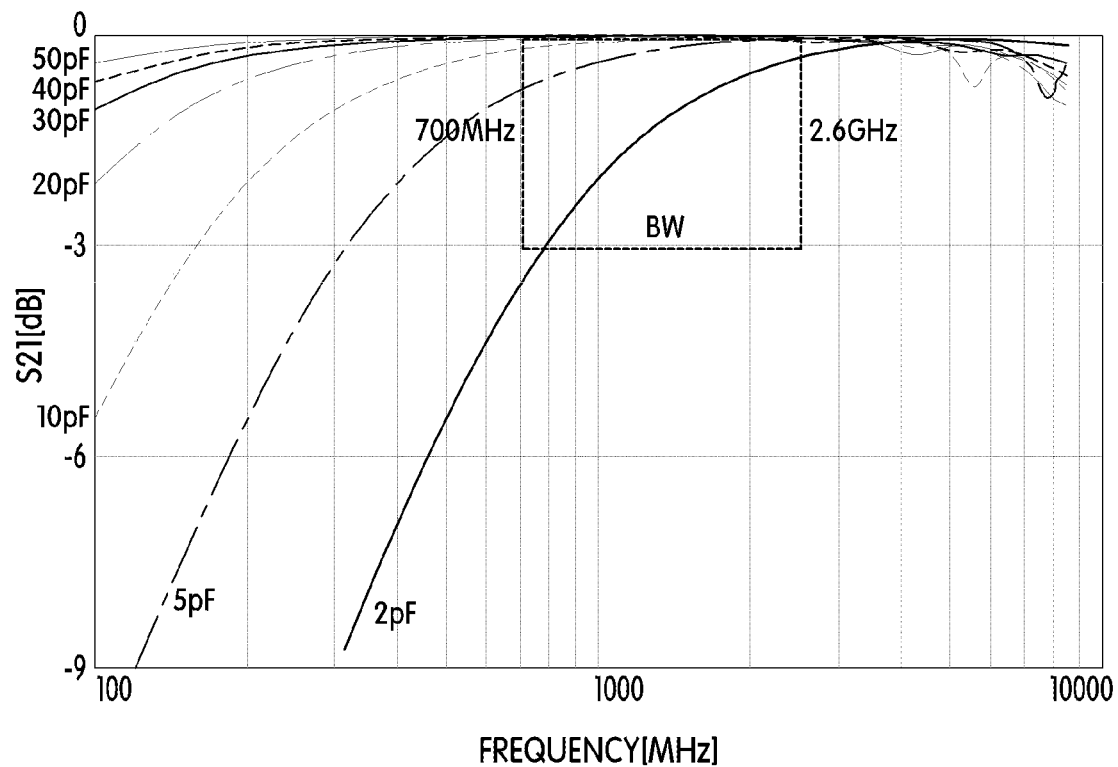
FIGS. 6A and 6B are graphs illustrating a simulation result for pass frequency band according to capacitance.
Figure 6B:
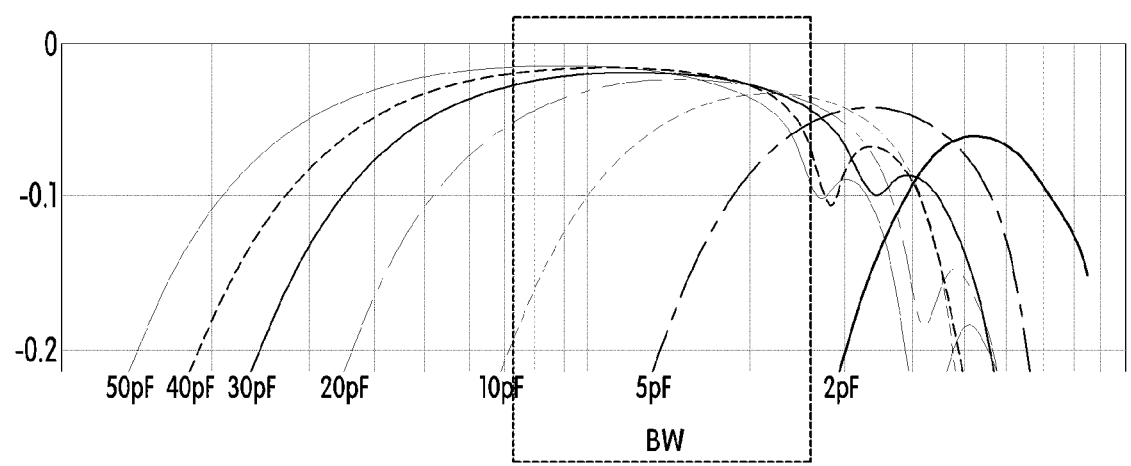

Herein, the capacitance of the capacitor layers 120a and 120b may be set to pass communication signals in an important wireless communication band without attenuation. As shown in FIGS. 6A and 6B, according to a result obtained by simulating a pass frequency band depending on a capacitance, with respect to a capacitance of more than 5 pF, signals are delivered substantially with little loss in a mobile wireless communication frequency band (for example, 700 MHz to 2.6 GHz) so that it represents an electrical short phenomenon.

However, as shown in FIG. 6B, when looking at a detailed influence, it is seen that reception sensitivity is hardly affected during communication in an capacitance of more than about 30 pF and accordingly, the capacitance of the capacitor layer may use a high capacitance of more than 30 pF in a mobile wireless communication frequency band.

As a result, the electric shock protection device 100 may pass communication signals flowing from the conductor 12 by a high capacitance of the capacitor layer 120*a* and 120*b* without attenuation.

Hereinafter, various embodiments of an electric shock protection device will be described in more detail with reference to FIGS. 7 to 12.

In relation to the electric shock protection device 100, the first inner electrode 111*a* and the second inner electrode 112*a* configuring an inner electrode in the sintered body may be provided in various forms and patterns and the first inner electrode 111*a* and the second inner electrode 112*a* may be provided in the same pattern or may be provided in different patterns.

Figure 7A:
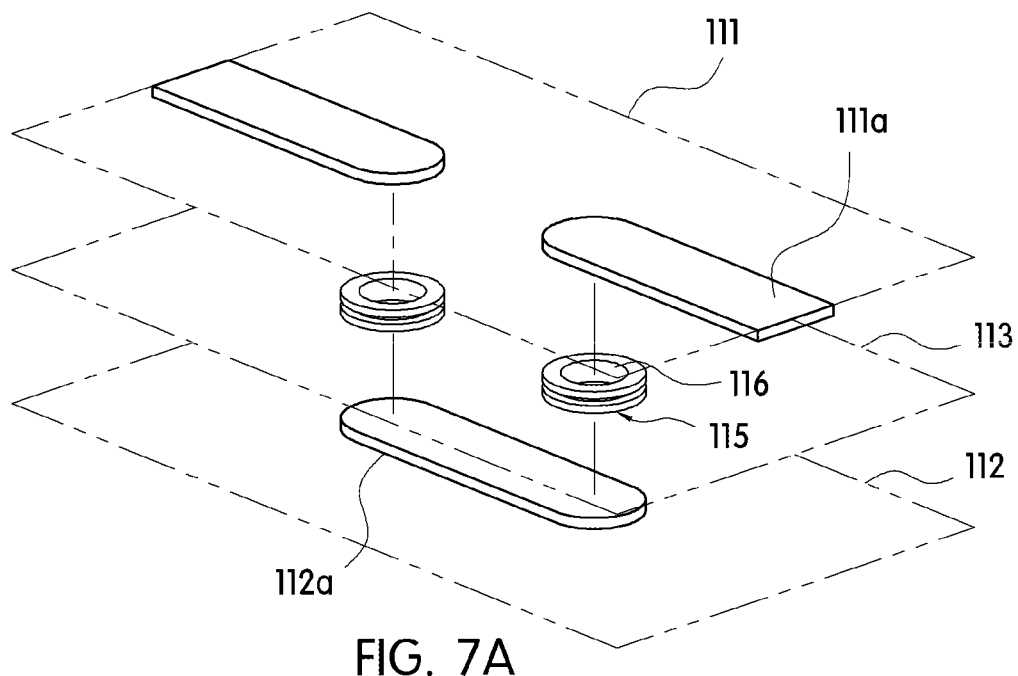
FIGS. 7A to 7E are views illustrating a variety of forms of an inner electrode in an electric shock protection device according to an embodiment of the present invention.

As one example, as shown in FIG. 7A, the end parts of the pair of first inner electrodes 111*a* are provided to overlap both end parts of the second inner electrode 112*a* of a bar form with a predetermined length and one pore-forming member 115 having a discharging material layer applied inner wall may be disposed in each overlapping area.

Figure 7B:
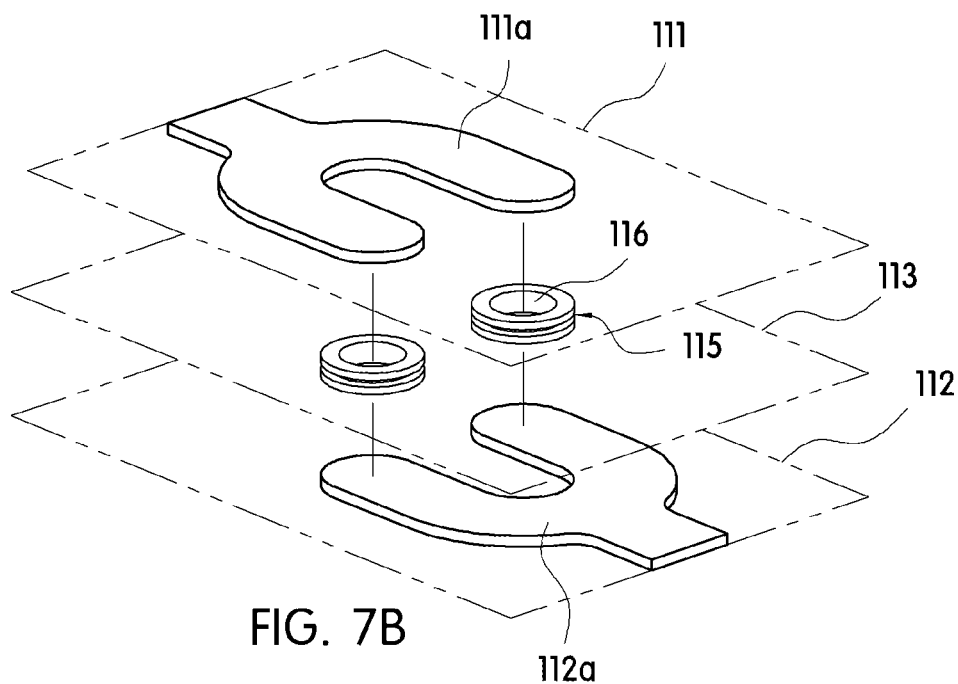

Additionally, as shown in FIG. 7B, the first inner electrode 111*a* and the second inner electrode 112*a* are provided in a form of about 'Y', and two parts of the first inner electrode 111*a* are provided to overlap two parts of the second inner electrode 112*a*, and the pore-forming members 115 having a discharging material layer applied inner wall may be respectively disposed at the overlapping portions.

Figure 7C:
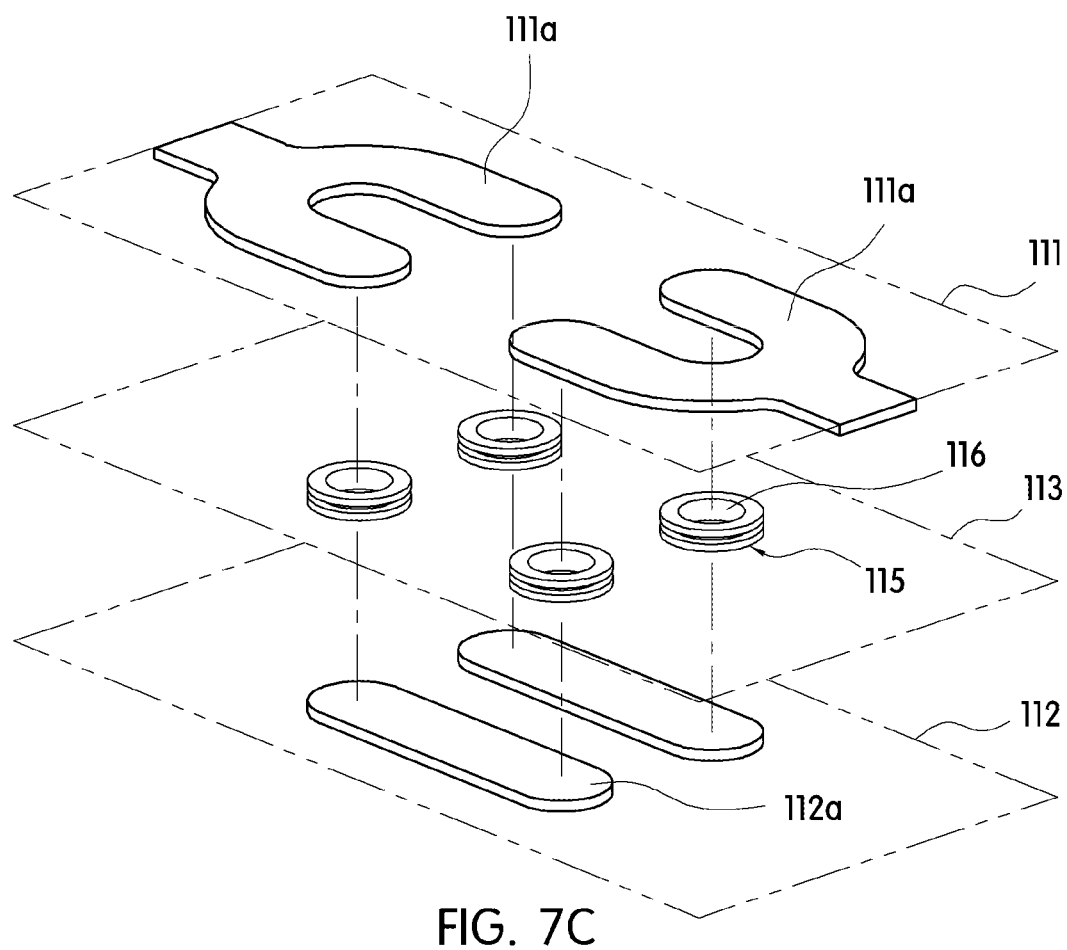

Furthermore, as shown in FIG. 7C, the second inner electrode 112*a* having a bar form with a predetermined length is provided in two, and the first inner electrode 111*a* is provided in a form of about 'Y', and four portions thereof are disposed to overlap the first inner electrodes 112*a*, and the pore-forming members 115 having a discharging material layer applied inner wall may be respectively disposed at the four overlapping portions.

Figure 7D:
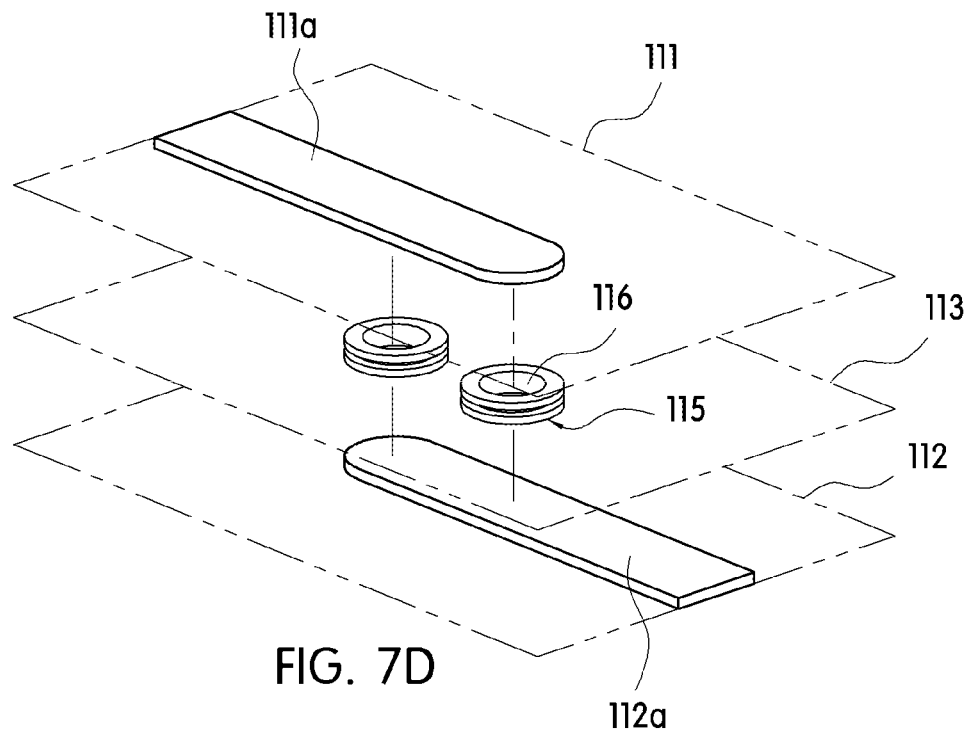

Additionally, as shown in FIG. 7D, the first inner electrode 111*a* and the second inner electrode 112*a* are provided each in a bar form with a predetermined length, and two pore-forming members 115 having a discharging material layer applied inner wall may be disposed spaced a predetermined internal apart from each other in the overlapping area.

Figure 7E:
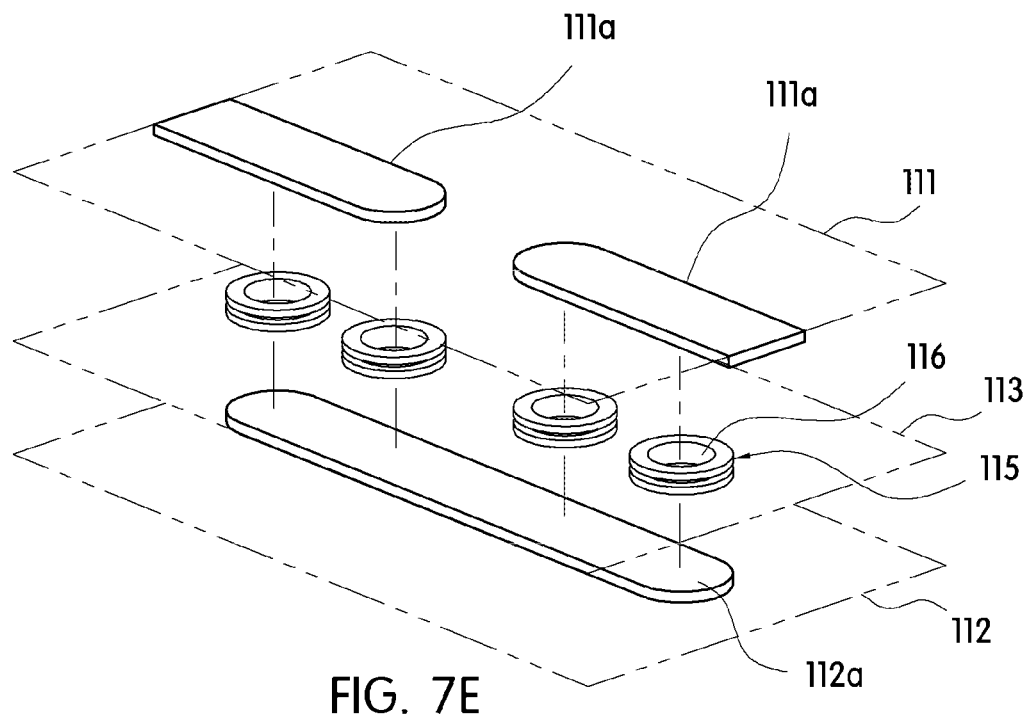

Furthermore, as shown in FIG. 7E, the second inner electrode 112*a* having a bar form with a predetermined length is provided, and the first inner electrode 111*a* is provided in two bar forms with a predetermined length and their portions are disposed to overlap both end parts of the second inner electrode 112*a*, and two discharging material applied pore-forming members 115 may be disposed in each overlapping area.

In such a way, the first inner electrode 111*a* and the second inner electrode 112*a* may be provided in various forms and patterns and it should be clarified that when they are stacked, as long as portions of the first inner electrode 111*a* and the second inner electrode 112*a* are disposed to overlap each other, it does not matter.

As another embodiment, as shown in FIGS. 8A to 8D, the electric shock protection device 100 and the capacitor layers 120*a* and 120*b* may be stacked in various methods.

Figure 8A:
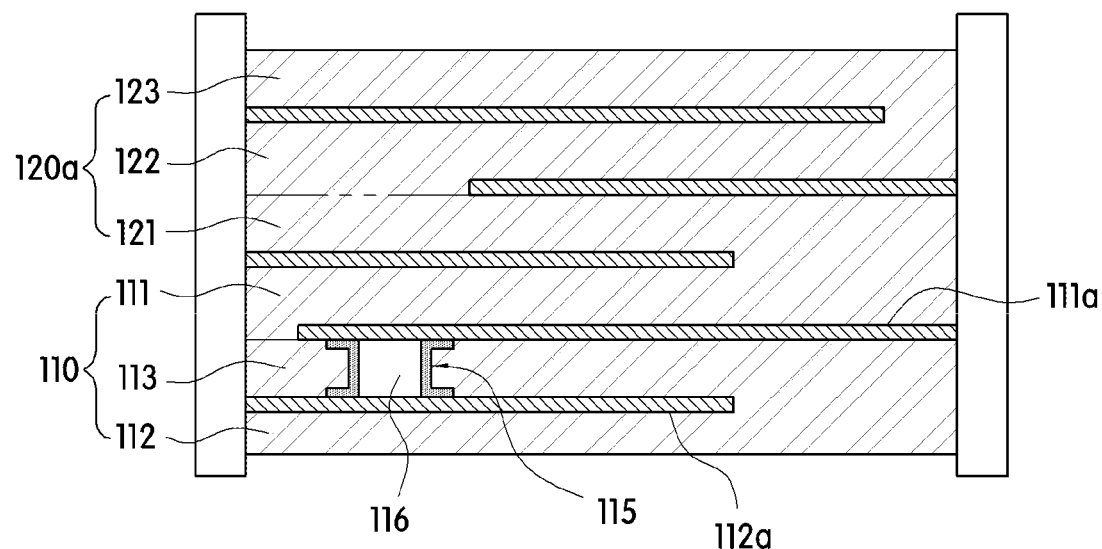
FIGS. 8A to 8D are cross-sectional views illustrating various arrangement relationships of an electric shock protection unit and a capacitor layer in an electric shock protection device according to an embodiment of the present invention.
Figure 8B:
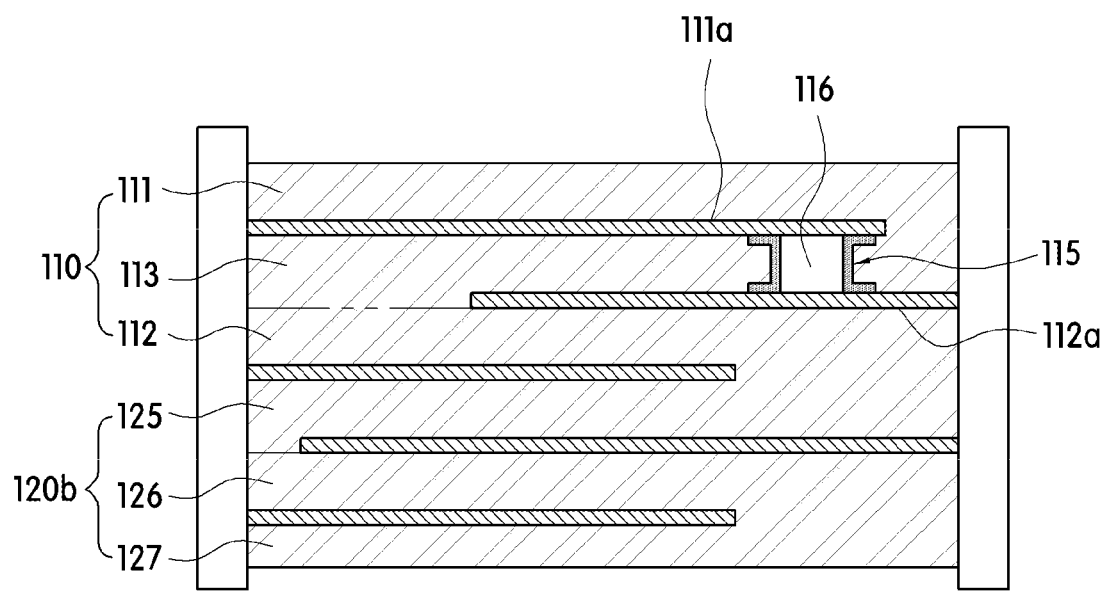

That is, as shown in FIG. 8A, the capacitor layer 120*a* may be stacked on only the upper part of the electric shock protection unit 110 and as shown in FIG. 8B, may be stacked on the lower part of the electric shock protection unit 110.

Figure 8C:
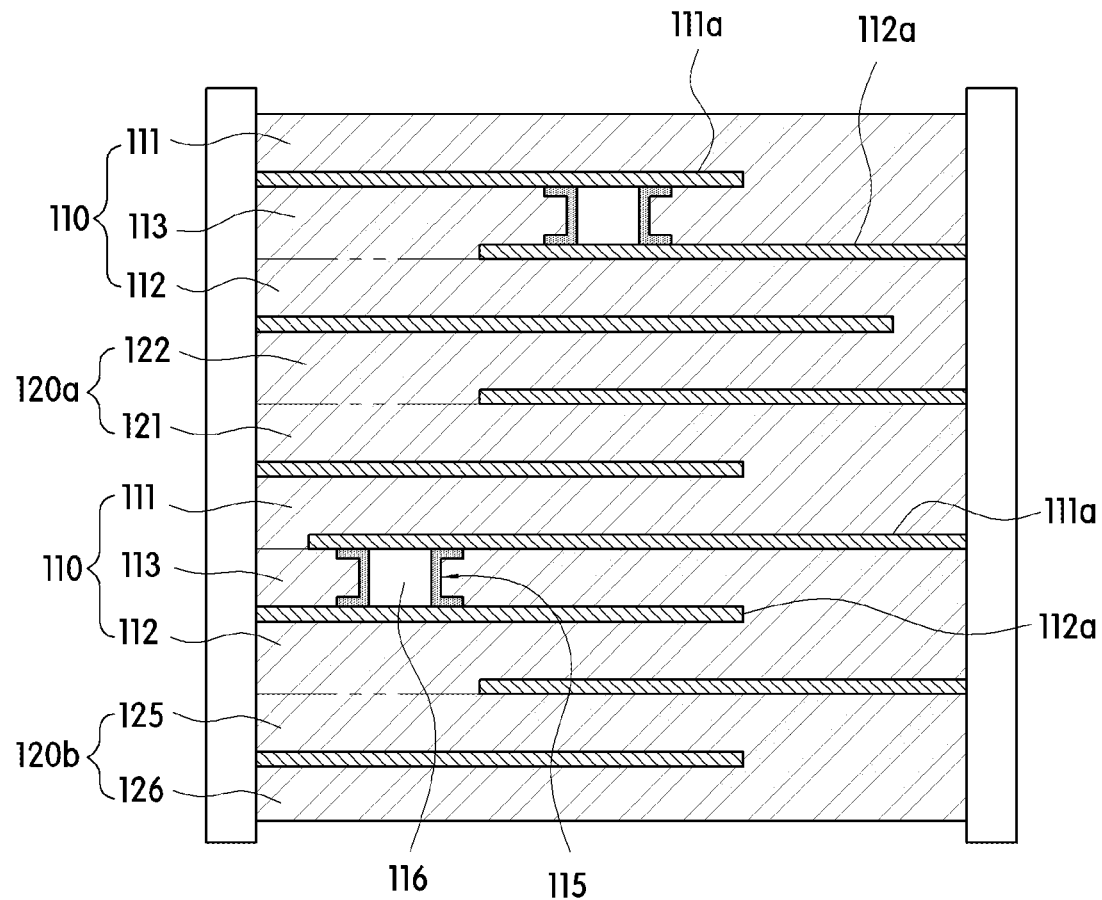
Figure 8D:
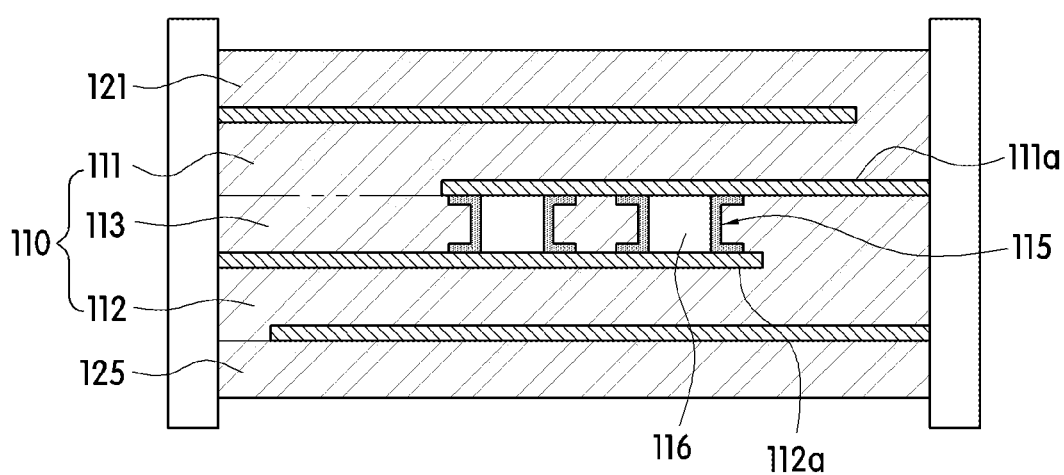

Furthermore, the electric shock protection unit 110 may be provided in plurality. For example, as shown in FIG. 8C, the capacitor layers 120*a* and 120*b* may be disposed between the plurality of electric shock protection units 110 and as shown in FIG. 8D, two capacitor layers 120*a* and 120*b* are symmetrically arranged based on the electric shock protection unit 110 and a plurality of pore-forming members 115 may be disposed in the electric shock protection unit 110.

That is, in relation to the electric shock protection device 100, it may be configured that a plurality of capacitor layers may be symmetrically or asymmetrically provided based on the electric shock protection unit 110 and a plurality or electric shock protection units 110 are disposed between a plurality of capacitor layers.

In such a way, it should be clarified that the number of the capacitor layers 120*a* and 120*b* and the electric shock protection units 110 for configuring the electric shock protection device 100 is not restricted, and they may be provided in various numbers according to a desired capacitance, and a stacked relationship of the electric shock protection unit 110 and the capacitor layers 120*a* and 120*b* may vary also.

As another embodiment, as shown in FIGS. 9A to 9G, in relation to an electric shock protection device 100', a plurality of sheet layers forming the sintered body may be formed of a different kind of ceramic material.

More specifically, at least one sheet layer among a plurality of sheet layers configuring the capacitor layers 120*a* and 120*b* uses a first ceramic material A and the remaining sheet layers may use a second ceramic material B.

At this point, the first ceramic material and the second ceramic material may be different kinds of ceramic materials. Here, the meaning of "different kind" means that their formulas are different from each other or even of their formulas are the same, physical properties are different from each other.

That is, the first ceramic material and the second ceramic material may be formed of a metal-oxide compound including at least one selected from $Er_2O_3$, $Dy_2O_3$, $Ho_2O_3$, $V_2O_5$, $CoO$, $MoO_3$, $SnO_2$, $BaTiO_3$, and $Nd_2O_3$ or may be formed of ferrite and LTCC or HTCC may be used.

Further more, the first ceramic material may be formed of a metal-oxide compound including at least one selected from $Er_2O_3$, $Dy_2O_3$, $Ho_2O_3$, $V_2O_5$, $CoO$, $MoO_3$, $SnO_2$, $BaTiO_3$, and $Nd_2O_3$ and the second ceramic material may be formed of ferrite, and the first ceramic material may be formed of LTCC and the second ceramic material may be formed of HTCC.

Additionally, each of the first ceramic material and the second ceramic material may be formed of a metal-oxide compound including at least one selected from $Er_2O_3$, $Dy_2O_3$, $Ho_2O_3$, $V_2O_5$, $CoO$, $MoO_3$, $SnO_2$, $BaTiO_3$, and $Nd_2O_3$, or may be formed of ferrite.

That is, the first ceramic material and the second ceramic material may be provided in mutually combined various forms among metal-oxide compounds, ferrite, LTCC, and HTCC and different kinds of ceramic materials are mutually bonded to each other through a firing or hardening process.

Moreover, in relation to the capacitor layers 120*a* and 120*b* formed of different kinds of ceramic materials in the electric shock protection device 100' according to an embodiment of the present invention, different kinds of a first ceramic material and a second ceramic material may be disposed through various methods on the basis of the electric shock protection unit 110.

Figure 9A:
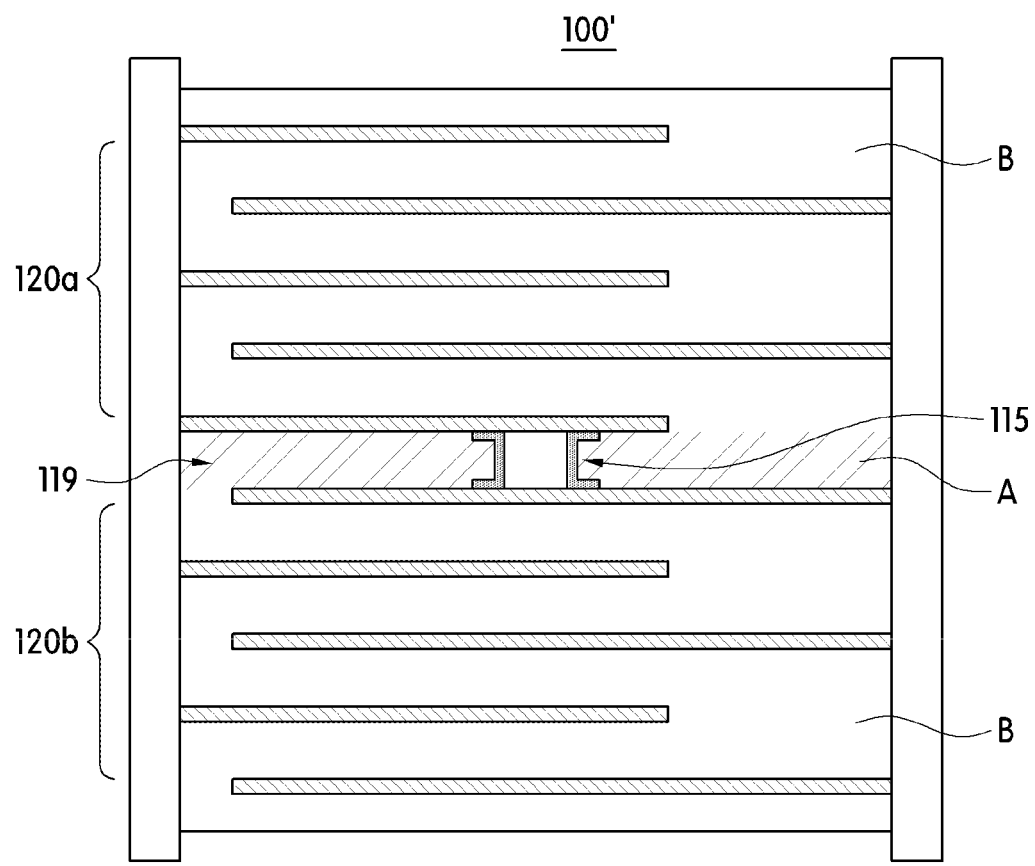
FIGS. 9A to 9G are cross-sectional views illustrating various arrangement relationships of a first ceramic material and a second ceramic material in an electric shock protection device according to an embodiment of the present invention.

The capacitor layers 120*a* and 120*b* bonded to the top/bottom of the electric shock protection unit 110 are formed of the first ceramic material A and as shown in FIG. 9A, the capacitor layers 120a and 120b disposed at the uppermost layer and the lowermost layer of the electric shock protection device 100' may be formed of the second ceramic material B.

Hereinafter, for convenience of description, it is defined that the second ceramic material is a different type of material.

A variety of positional relationships between the first ceramic material and the second ceramic material are shown in FIGS. 9A to 9G. An unhatched portion A may mean that a sheet is formed of the first ceramic material and a hatched portion B means that a sheet is formed of the second ceramic material. That is, reference numerals A and B refer to materials of sheets in FIGS. 9A to 9G.

More specifically, the entire of a plurality of sheet layers configuring the capacitor layers 120a and 120b may be formed of the first ceramic material A and the second ceramic material B.

Additionally, some of a plurality of sheet layers configuring the capacitor layers 120a and 120b may be formed of the first ceramic material A and the remaining sheets among the plurality of sheet layers configuring the capacitor layers 120a and 120b may be formed of a different type of the second ceramic material B.

Figure 9B:
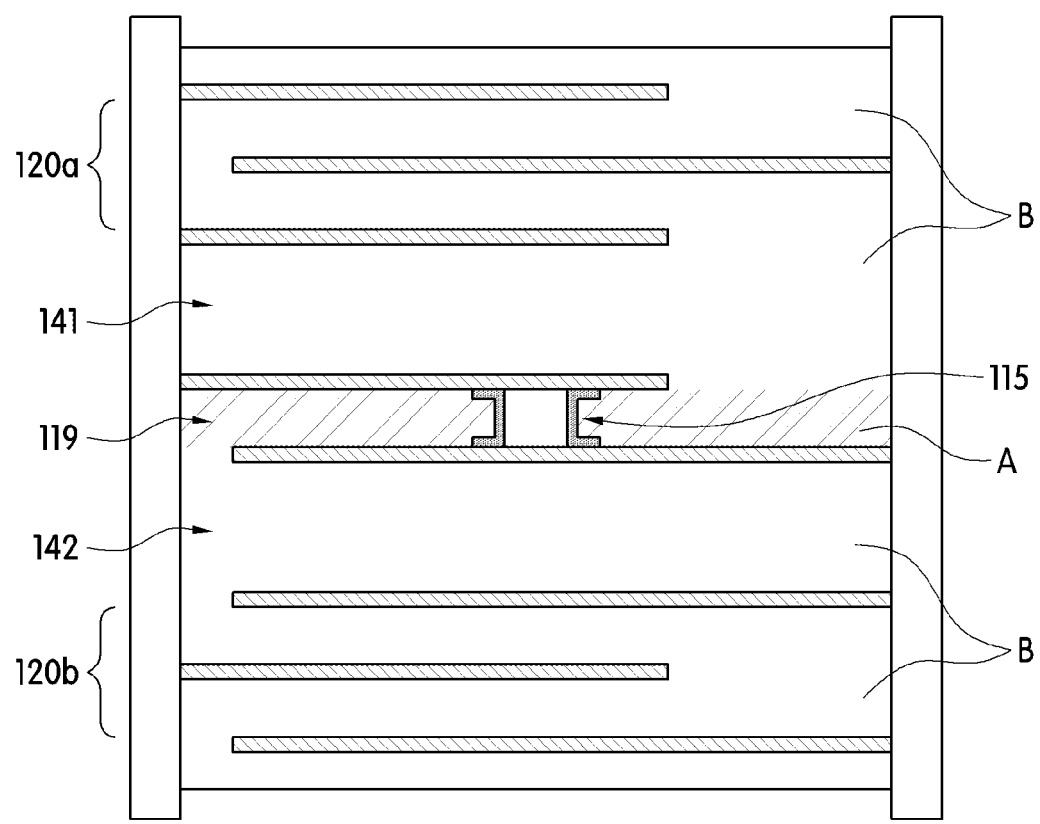

On the other hand, as shown in FIG. 9B, at least one of middle sheet layers 141 and 142 may be disposed between the electric shock protection 110 and the capacitors layers 120a and 120b and the middle sheet layers 141 and 142 may be formed of the second ceramic material B that is equal to that of the capacitor layers 120a and 120b. Herein, the middle sheet layers 141 and 142 may be provided as an additional sheet layer but a thickness of a sheet layer disposed at the lowermost layer or the uppermost layer of the capacitor layers 120a and 120b may be provided to be relatively thicker than a thickness of another sheet layer.

Figure 9C:
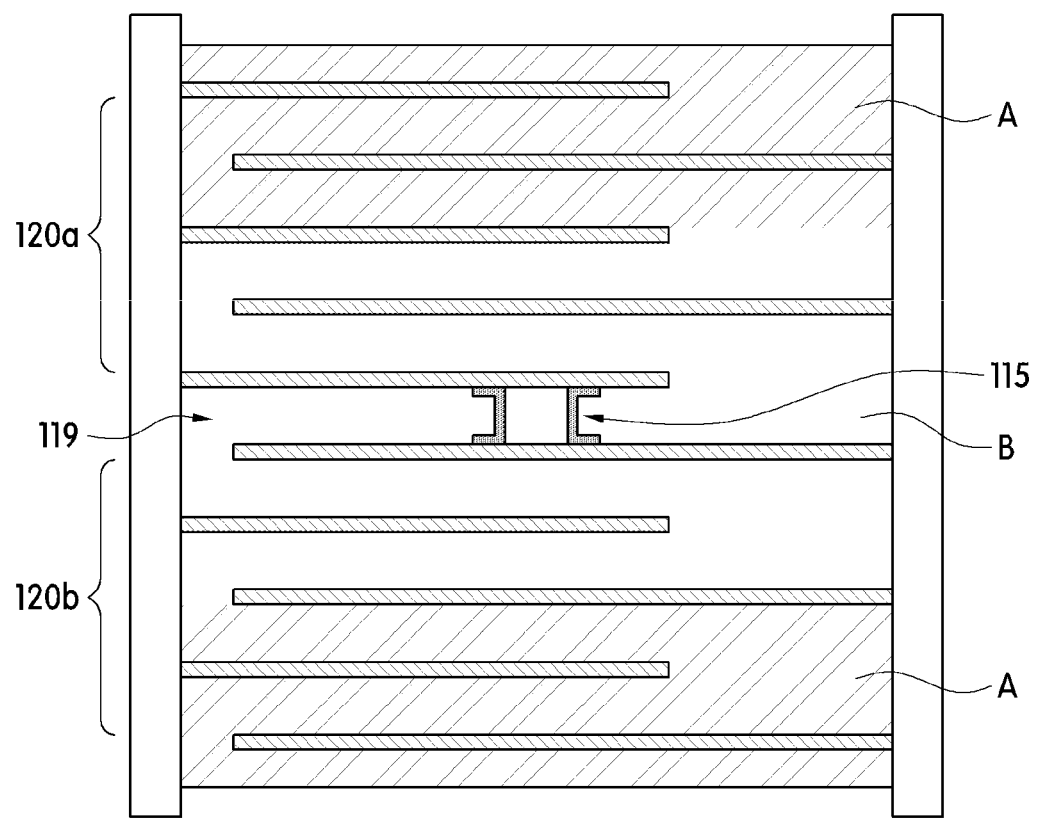

Additionally, as shown in FIG. 9C, the capacitor layers 120a and 120b may be formed the first ceramic material A that is a different type of ceramic material and the protective sheet layer 119 may be formed of the second ceramic material B.

Figure 9D:
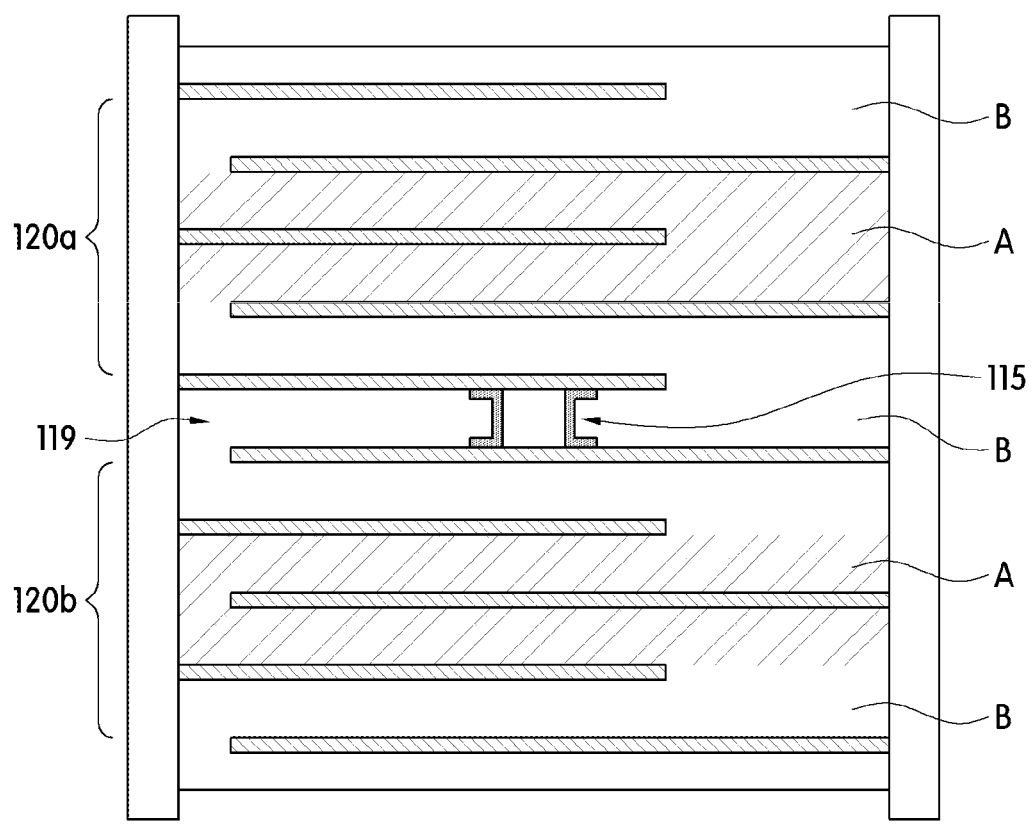

At this point, as shown in FIG. 9D, at least one of middle sheet layers 141 and 142 may be disposed between the electric shock protection 110 and the capacitor layers 120a and 120b and the middle sheet layers 141 and 142 may be formed of the second ceramic material B that is equal to that of the protective sheet layer 119. Herein, the middle sheet layers 141 and 142 may be provided as an additional sheet but a thickness of a sheet disposed at the lowermost layer or the uppermost layer of the capacitor layers 120a and 120b may be provided to be relatively thicker than a thickness of another sheet.

Figure 9E:
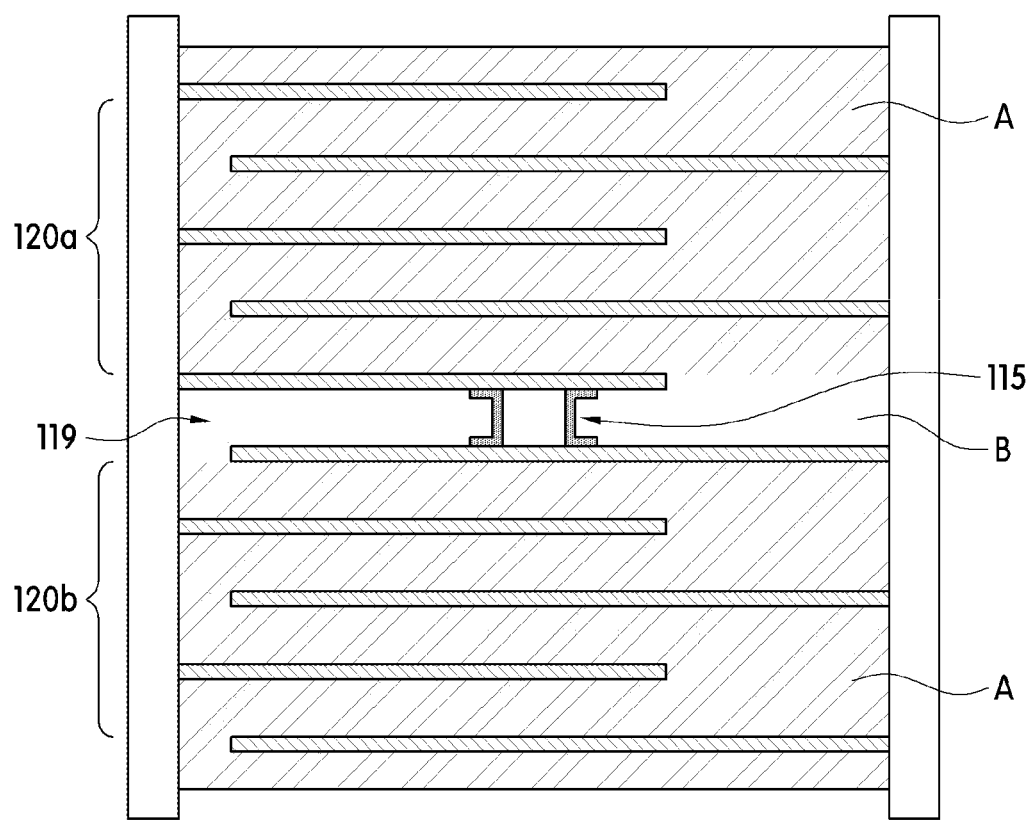
Figure 9F:
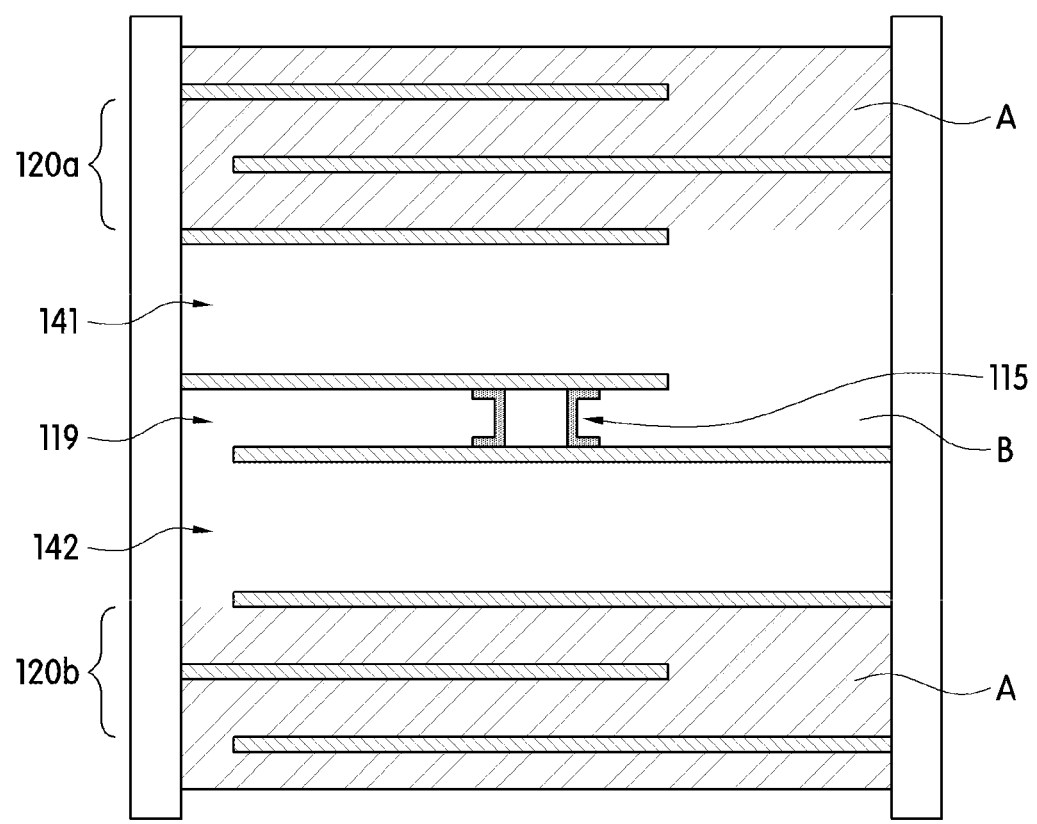

As shown in FIGS. 9E and 9F, some of a plurality of sheet layers configuring the capacitor layers 120a and 120b may be formed of the first ceramic material A that is a different type of material and the remaining sheets among the plurality of sheet layers configuring the capacitor layers 120a and 120b and the protective sheet layer 119 may be formed of the second ceramic material B.

Figure 9G:
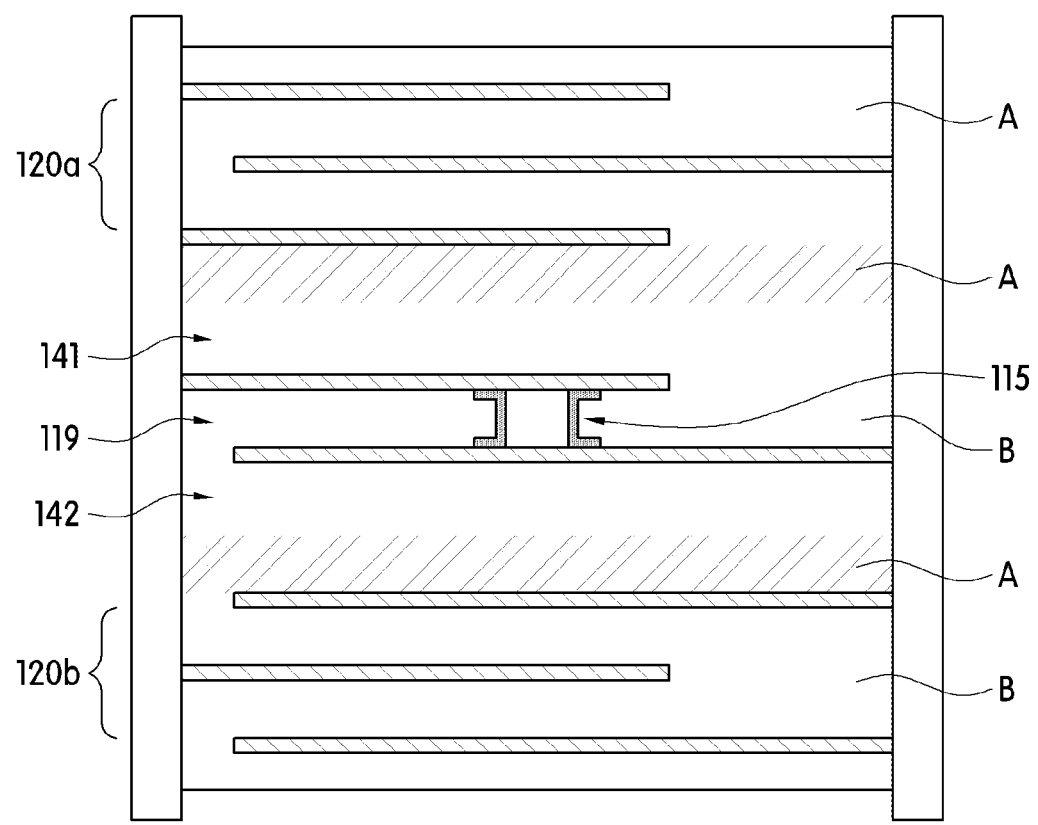

Furthermore, as shown in FIG. 9G, the electric shock protection unit 110 and the capacitor layers 120a and 120b may be formed of the second ceramic material B and at least one of middle sheet layers 141 and 142 formed of the first ceramic material A that is a different type of material may be disposed between the electric shock protection unit 110 and the capacitor layers 120a and 120b.

In such a way, the electric shock protection device 100' according to an embodiment of the present invention selects each of the first ceramic material A and the second ceramic material B and arranges the first ceramic material A that is a different type of ceramic at an appropriate position, thereby configuring the capacitor layers 120a and 120b of a high-k material to implement desired characteristics and also freely implement a characteristic change corresponding to required properties.

Moreover, as shown in FIGS. 9C to 9G, the protective sheet layer 119 configuring the sintered body is formed of a second ceramic material and when all or part of the remaining portion is configured with the first ceramic material that is a different type of ceramic material, the first ceramic material may be symmetrically disposed in a vertical direction on the basis of the protective sheet layer 119.

This is because it can achieve a uniform shrinkage and structural stability in consideration of matching of each material according to the bond of the first ceramic material and the second ceramic material that are different types of materials. Through such a structural stability, the reliability of an electric shock protection device can be improved.

On the other hand, it is shown in the drawing that the first ceramic material that is a different kind of material is symmetrically provided based on the protective sheet layer 119 but the present invention is not limited thereto and it should be clarified that the first ceramic material may be displayed asymmetrically on the basis of the protective sheet layer 119.

Furthermore, when the first ceramic material that is a different type of material is partially used for the capacitor layers 120a and 120b, products and capacities mainly for tolerance such as varistor materials may be further subdivided.

Herein, the first ceramic material that is a different type of material may be used as an appropriate thickness with respect to the entire thickness of the sintered body according to required characteristics and capacities.

Figure 10:
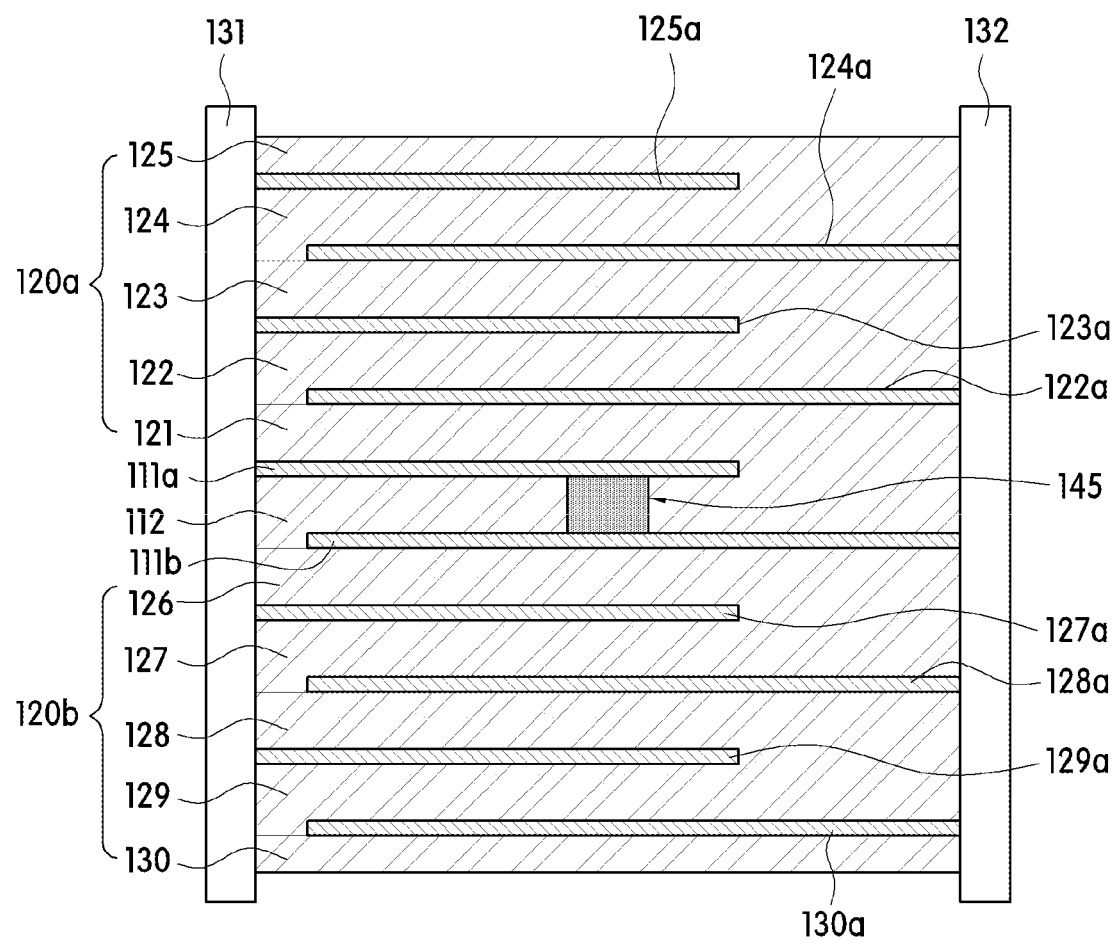
FIG. 10 is a cross-sectional view illustrating another example of an electric shock protection unit in an electric shock protection device according to an embodiment of the present invention.

As another embodiment, as shown in FIG. 10, the electric shock protection device may not use an additional pore-forming member and the discharging material layer 145 may be disposed between the inner electrodes 111a and 111b.

That is, in relation to the electric shock protection unit 110, at least part of the pair of inner electrodes 111a and 111b may be disposed at the top/bottom of the protective sheet layer 112 to overlap each other and the discharging material layer 145 may be disposed between the pair of inner electrodes 111a and 111b. Herein, the pair of inner electrodes 111a and 111b may be directly provided at the top/bottom surface of the protective sheet layer 112 but may be provided to a sheet stacked on the top/bottom of the protective sheet layer 112.

For example, as shown in FIG. 10, the pair of inner electrodes 111a and 111b are disposed to partially overlap each other and the discharging material layer 145 having the inside filled is disposed between the overlapping pores of the first inner electrode 111a and the second inner electrode 111b.

More specifically, the first inner electrode 111a and the second inner electrode 111b are spaced a predetermined interval apart from each other vertically through the protective sheet layer 112, and portions of the first inner electrode 111a and the second inner electrode 111b are disposed to overlap each other with a predetermined interval, and the discharging material layer 155 is disposed in an area where the first inner electrode 111a and the second inner electrode 111b overlap each other.

As another embodiment, as shown in FIGS. 11A to 11D, an electric shock protection device 100" may not use an additional pore-forming member and a pore 154 may be formed between the inner electrodes 111a and 112a. At this point, a sidewall of the pore 154 may include a discharging material layer 155.

That is, in relation to the electric shock protection device 100″, a protective sheet layer 113 may be disposed between the pair of inner electrodes 111a and 112a facing each other and at least one through hole 154 penetrating the protective sheet layer 113 may be configured. Herein, the through hole 154 is formed to be disposed in an area where the pair of inner electrodes 111a and 112a disposed vertically on the basis of the protective sheet layer 113 overlap each other.

Figure 11A:
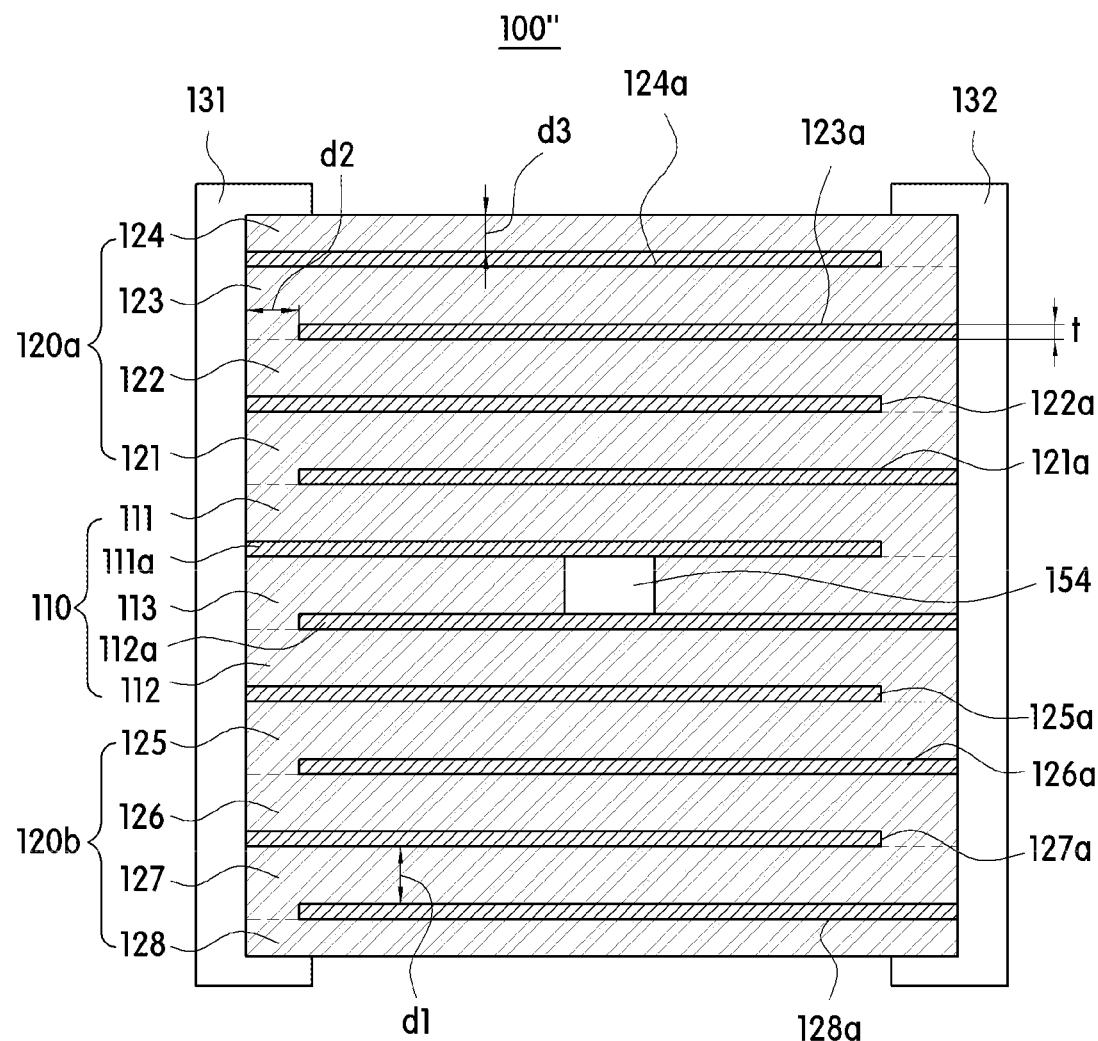
FIGS. 11A to 11D are cross-sectional views illustrating a variety of forms of a pore in an electric shock protection device according to an embodiment of the present invention.

More specifically, in relation to the electric shock protection device", as shown in FIG. 11A, a first sheet layer 111 including the first inner electrode 111a at the bottom surface and a second sheet layer 112 including the second inner electrode 112a at the top surface are stacked vertically and the protective sheet layer 113 including at least one through hole 154 is disposed between the first sheet layer 111 and the second sheet layer 112.

The first sheet layer 111, the protective sheet layer 113, and the second sheet layer 112 may be sequentially stacked to allow the first inner electrode 111a and the second inner electrode 112a to face each other.

Accordingly, after the first inner electrode 111a and the second inner electrode 112a are disposed to face each other, they are spaced a predetermined interval apart from each other by the protective sheet layer 113 and the through hole 154 is disposed in the overlapping areas facing each other.

At this point, the through hole 154 disposed in the overlapping area of the first inner electrode 111a and the second inner electrode 112a may be provided in various forms.

On the other hand, when the pair of external electrodes 131 and 132, as shown in FIG. 11A, are provided to have a section of an about '⊏' form extending in a horizontal direction from the upper end and the lower end to cover portions of the top surface and the bottom surface of the sintered body, an interval d3 between portions extending in a horizontal direction in an inner electrode and an external electrode provided to the uppermost layer and the lowermost layer among a plurality sheet layers may be provided to have a distance of at least 15 μm and may be provided to have a distance in a range of 15 μm to 100 μm.

Figure 11B:
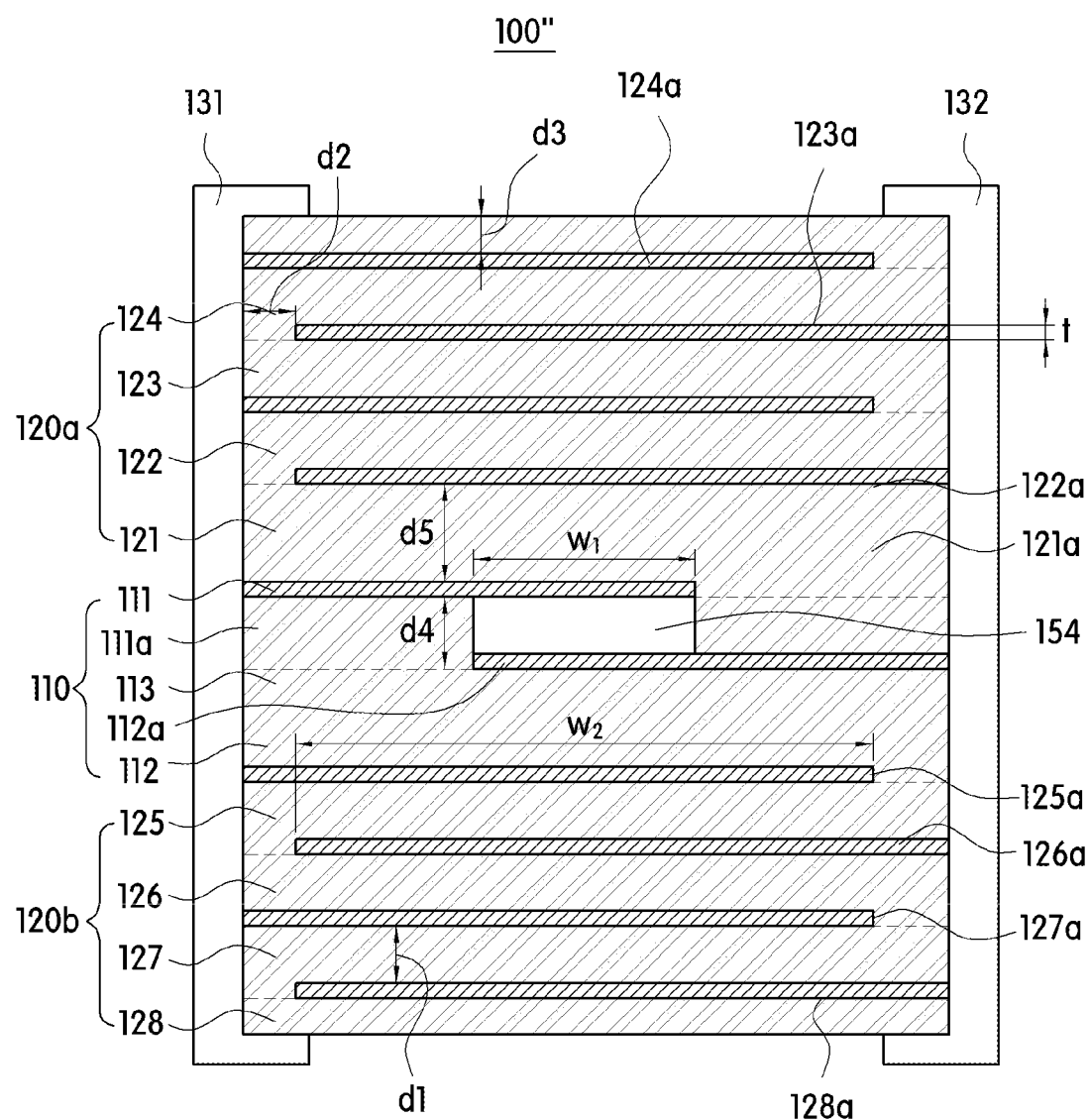

At this point, in relation to the electric shock protection device 100″, as shown in FIG. 11B, the electric shock protection unit 110 and the capacitor layers 120a and 120b may be configured with different electrode intervals and electrode widths.

That is, an interval d4 between the pair of inner electrodes 111a and 112a disposed to face each other may be equal to an interval d1 between the capacitor electrodes 121a, 122a, 123a, 124a, 125a, 126a, 127a, and 128a.

At this point, an interval d5 between the electric shock protection unit 110 and the capacitor layers 120a and 120b may be greater than an interval d4 between the pair of inner electrodes 111a and 112a.

That is, it is desirable to secure a sufficient interval with the inner electrodes 111a and 112a in order to prevent static electricity or leakage current flowing along the pair of inner electrodes 111a and 112a from leaking toward an adjacent capacitor electrode. At this point, a distance between the capacitor layers 120a and 120b and the electric shock protection unit 110 may be 15 μm to 100 μm and may be two times greater than an interval between the pair of inner electrodes 111a and 112a. For example, when an interval between the pair of inner electrodes 111a and 112a is 10 μm, a distance between the capacitor layers 120a and 120b and the electric shock protection unit 110 may be greater than 20 μm.

Additionally, an overlapping width w1 of the pair of inner electrodes 111a and 112a may be less than an overlapping width w2 of capacitor electrodes. Herein, a thickness of the pair of inner electrodes 111a and 112a may be less than a thickness t of a capacitor electrode.

At this point, the sintered body may include at least one of Ti, Zn, Ce, Nd, and Bi.

On the other hand, when a discharging material layer is applied to a pore formed between the pair of inner electrodes 111a and 112a, the discharging material layer may include at least one of Ti, Ni, Zn, Co, Tc, Zr, La, Nd, and Pt.

Figure 11C:
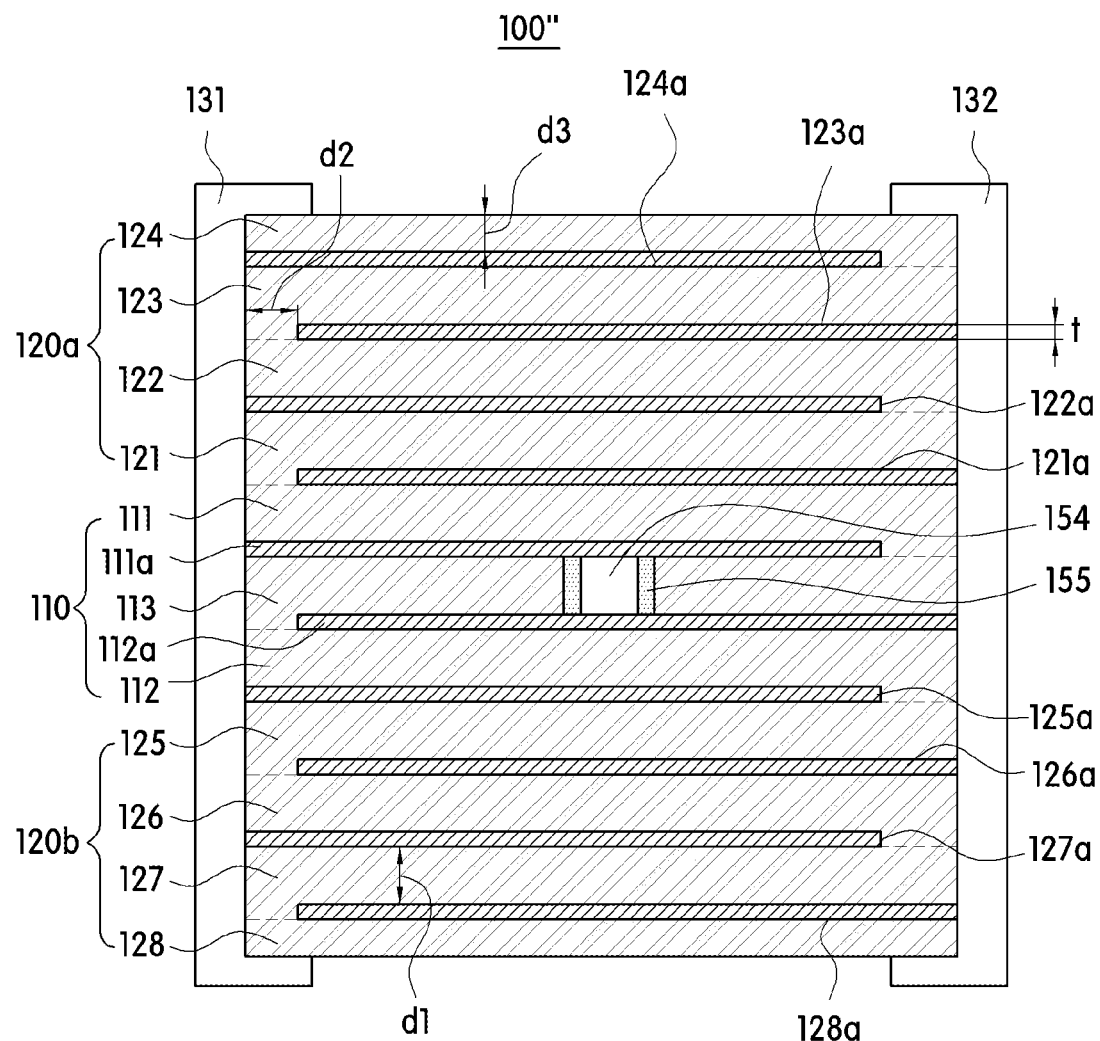
Figure 11D:
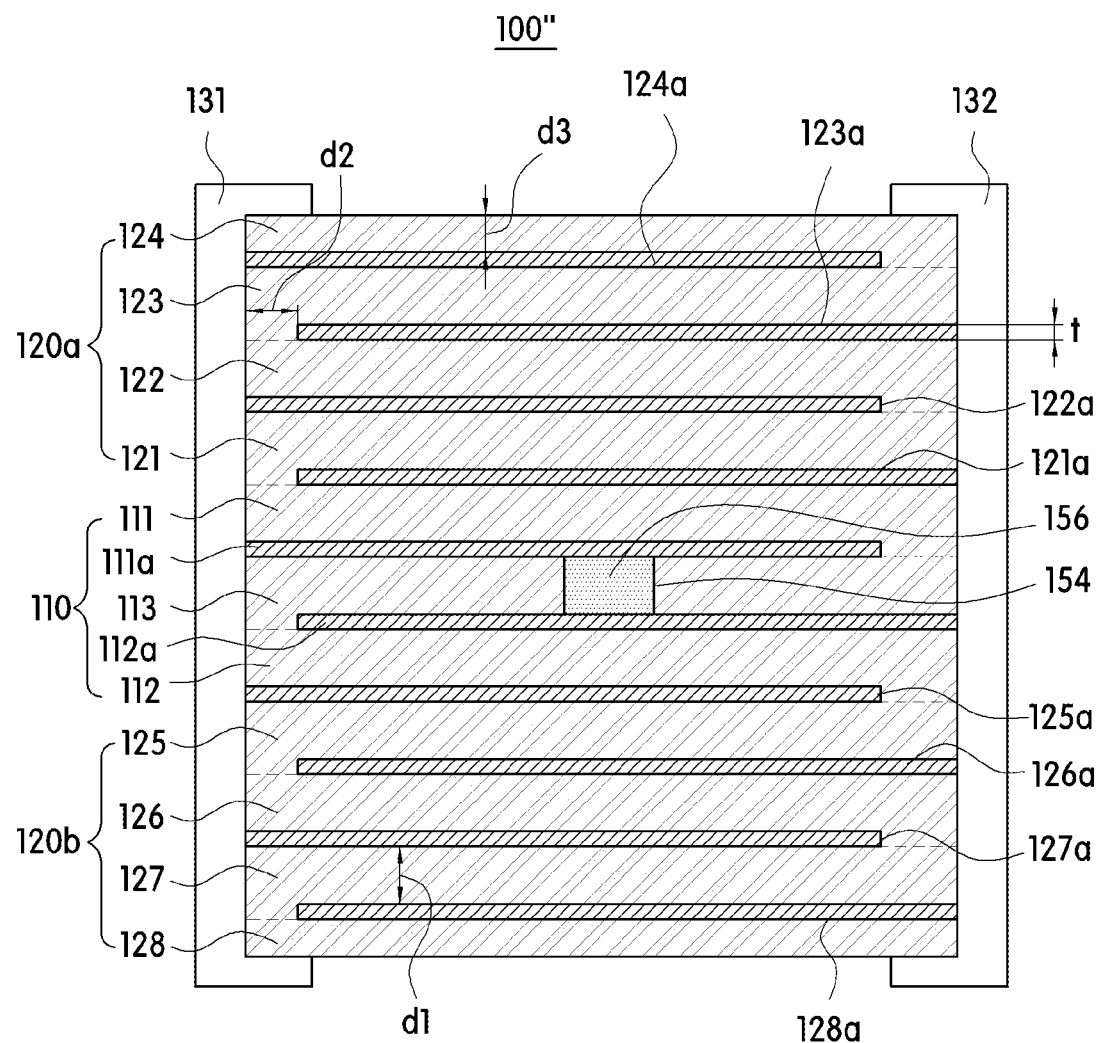

On the other hand, the electric shock protection unit 110, as shown in FIG. 11C, may include a discharging material layer 155 applied to the inner wall of the through hole 154 at a predetermined thickness along a height direction and as shown in FIG. 11D, may be filled with a filling material 156.

In such a way, in relation to the electric shock protection device 100″, the capacitor layers 120a and 120b may be stacked on the basis of the electric shock protection unit 110 through various methods.

Figure 12A:
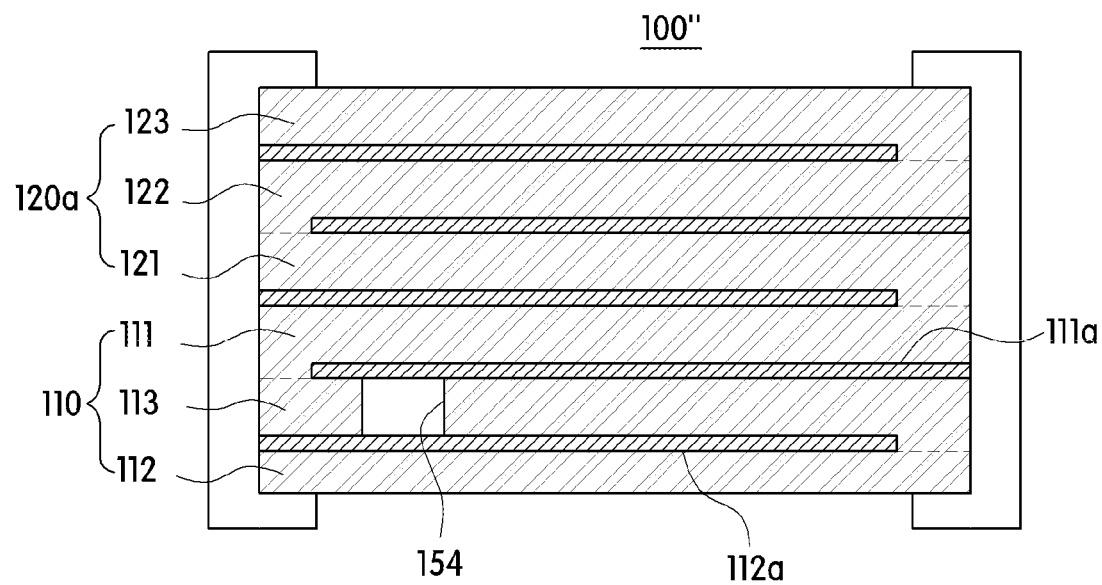
FIGS. 12A to 12D are views illustrating various arrangement relationships of an electric shock protection unit and a capacitor layer in an electric shock protection device according to an embodiment of the present invention.
Figure 12B:
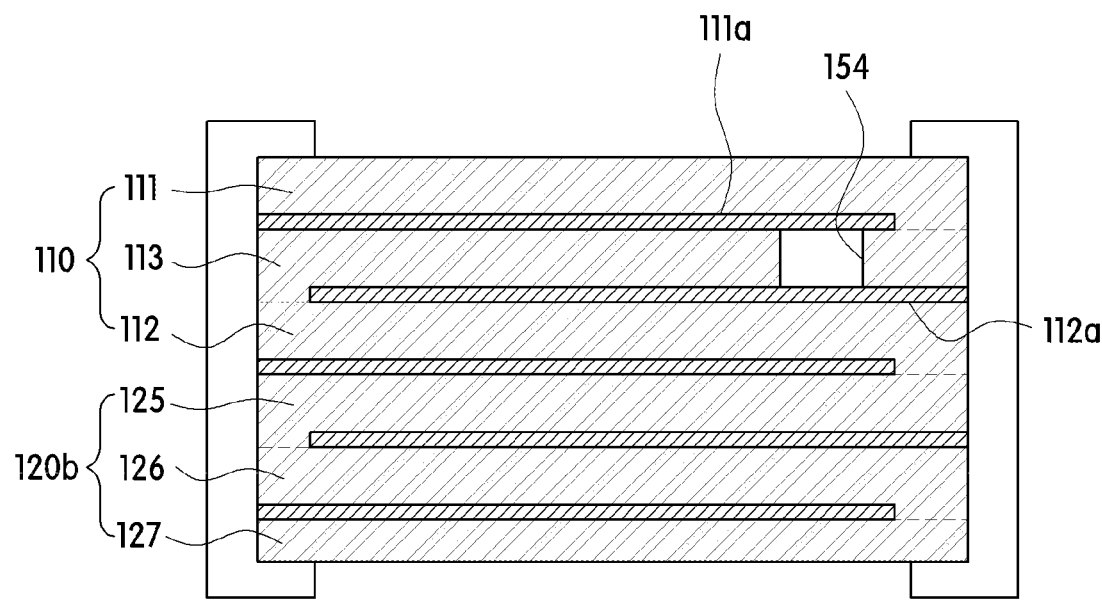

That is, the capacitor layers 120a and 120b may be configured by stacking a plurality of sheet layers 121, 122, 123, 124, 125, and 126, and as shown in FIG. 12A, may be stacked only at the upper part of the electric shock protection unit 110, and as shown in FIG. 12B, may be stacked only at the lower part of the electric shock protection unit 110.

Figure 12C:
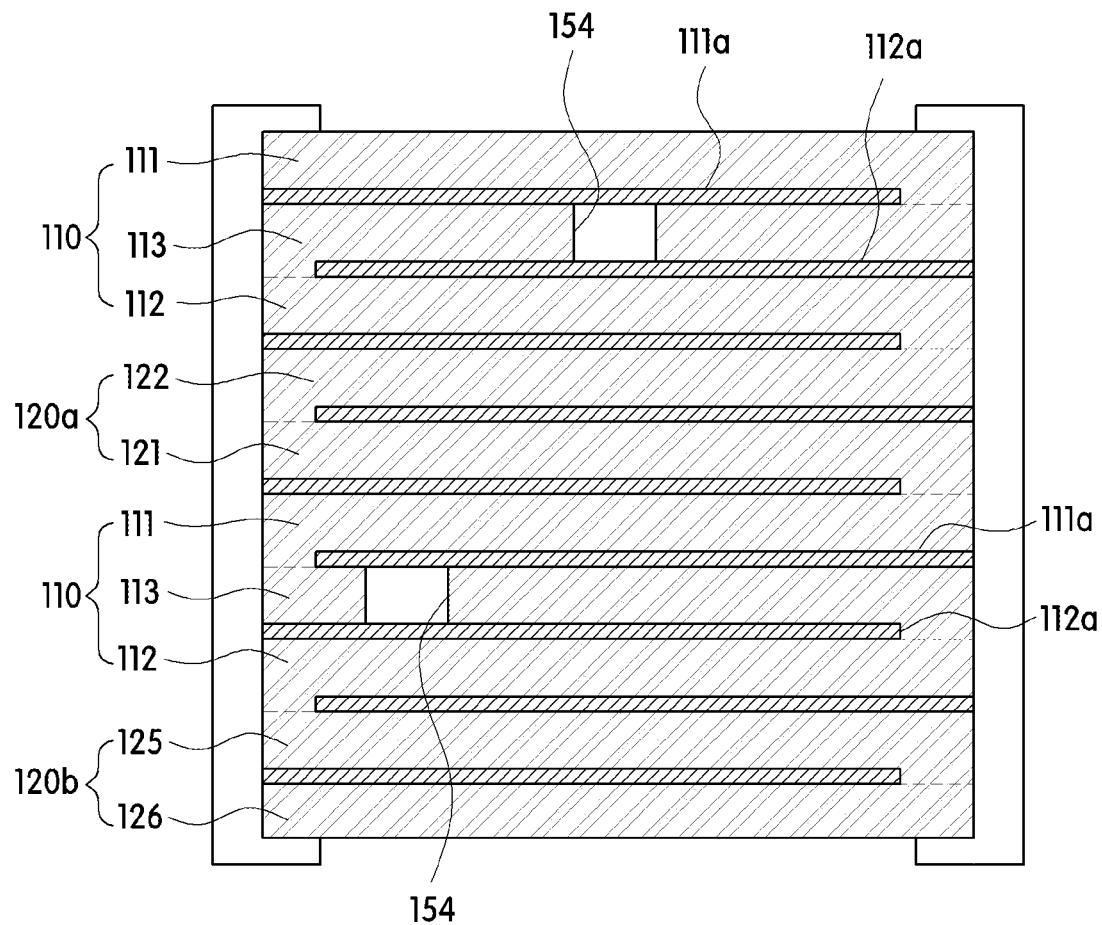

Furthermore, as shown in FIG. 12C, the electric shock protection unit 110 is provided in plurality on different layers and the capacitors layers 120a and 120b may be respectively disposed between the plurality of electric shock protection unit 110.

Figure 12D:
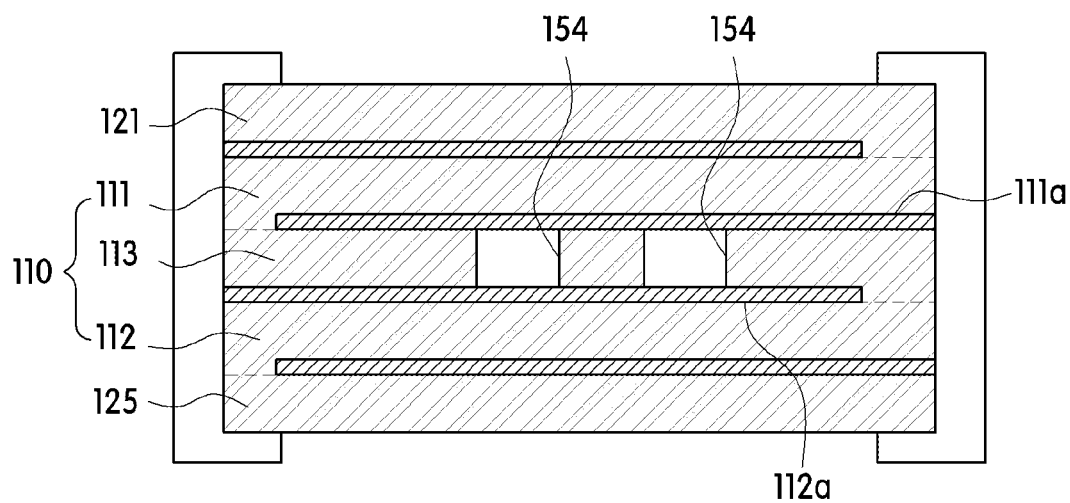

Additionally, as shown in FIG. 12D, the electric shock protection unit 110 is provided on the same sheet layer in a form of having a plurality of through holes 154 and the capacitor layers 121 and 125 formed of a single layer sheet may be symmetrically arranged at the upper/lower part of the electric shock protection unit 110.

In relation to the electric shock protection device 100″, the first inner electrode 111a and the second inner electrode 112a configuring an inner electrode in the sintered body may be provided in various forms and patterns and the first inner electrode 111a and the second inner electrode 112a may be provided in the same pattern or may be provided in different patterns.

Figure 13A:
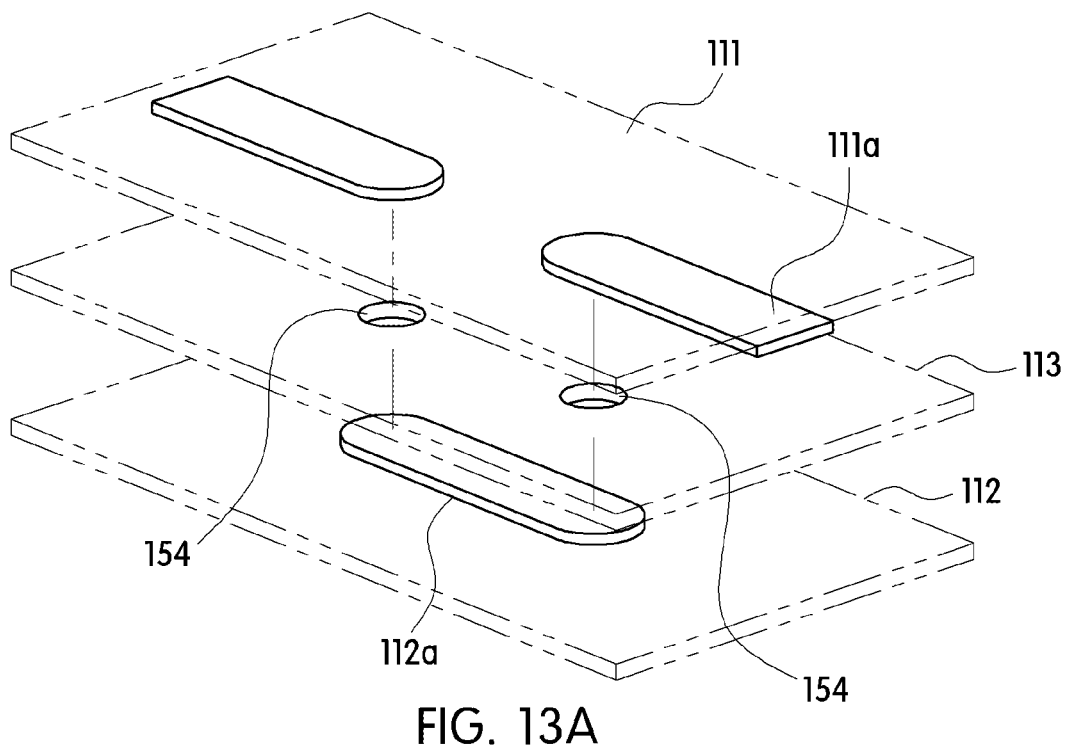
FIGS. 13A to 13E are views illustrating a variety of forms of an inner electrode of an electric shock protection device according to an embodiment of the present invention.
Figure 13B:
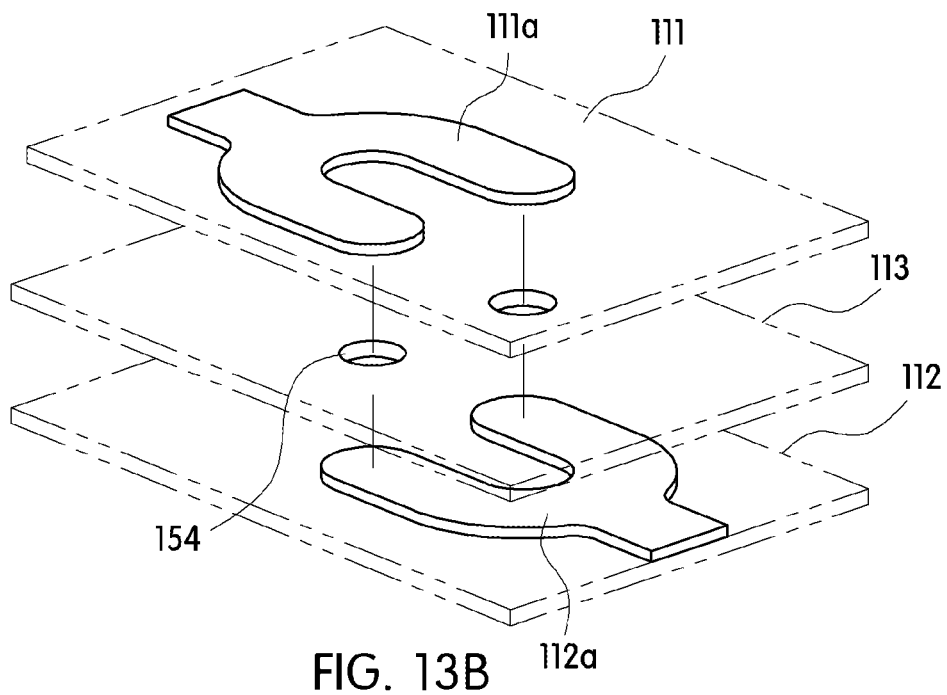

As one example, as shown in FIG. 13A, end parts of the pair of first inner electrodes 111a may be provided to overlap the upper part of the second inner electrode 112a having a bar form with a predetermined length and one through hole 154 may be disposed in each overlapping area. As shown in FIG. 13B, the first inner electrode 111a and the second inner electrode 112a may be provided in an about 'Y' form and two portions may be provided to overlap the other two portions and one through hole 154 may be disposed in each overlapping area.

Figure 13C:
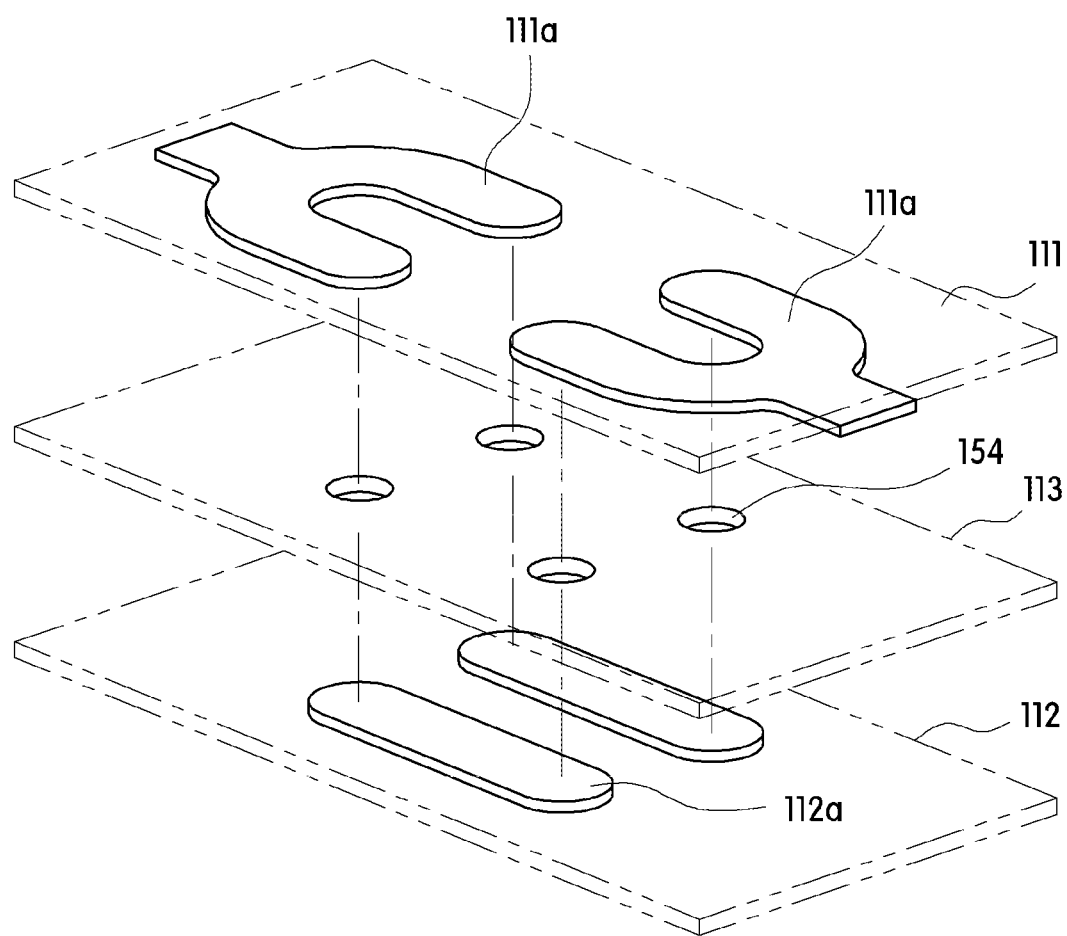

Furthermore, as shown in FIG. 13C, two second inner electrode 112a may be provided in a bar form with a predetermined length and two first inner electrodes 111a may be provided in an about 'Y' form so that four portions may be disposed to overlap each other and one through hole 154 may be disposed at each of the overlapping four portions.

Figure 13D:
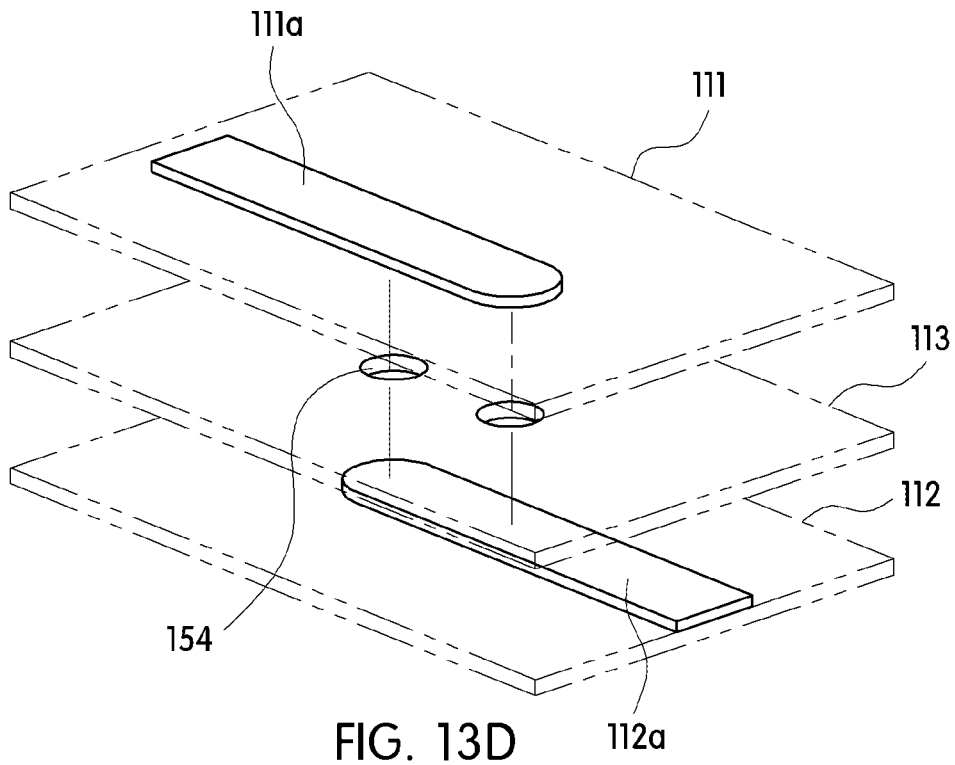

Additionally, as shown in FIG. 13D, the first inner electrode 111a and the second inner electrode 112a are provided each in a bar form with a predetermined length, and pore-forming members 154 may be disposed spaced a predetermined internal apart from each other in the overlapping area.

Figure 13E:
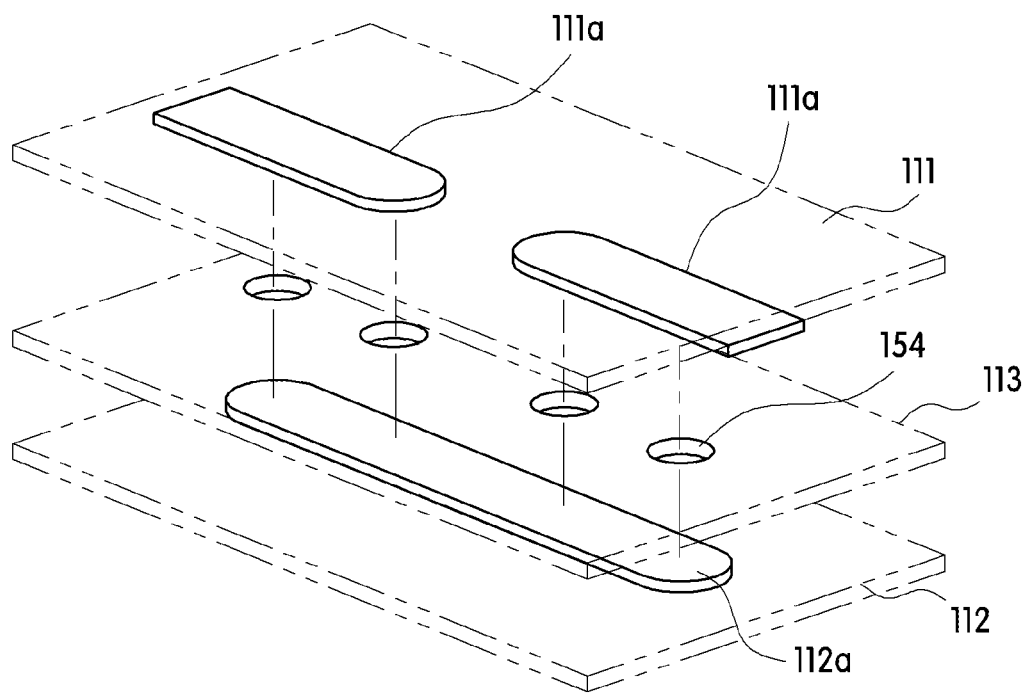

Furthermore, as shown in FIG. 13E, the second inner electrode 112a having a bar form with a predetermined length is provided, and the first inner electrode 111a is provided in two bar forms with a predetermined length and their portions are disposed to overlap both end parts of the second inner electrode 112a, and two through holes 154 may be disposed in each overlapping area.

In such a way, the first inner electrode 111a and the second inner electrode 112a may be provided in various forms and patterns and it should be clarified that when they are stacked, as long as portions of the first inner electrode 111a and the second inner electrode 112a are disposed to overlap each other, it does not matter.

Figure 14:
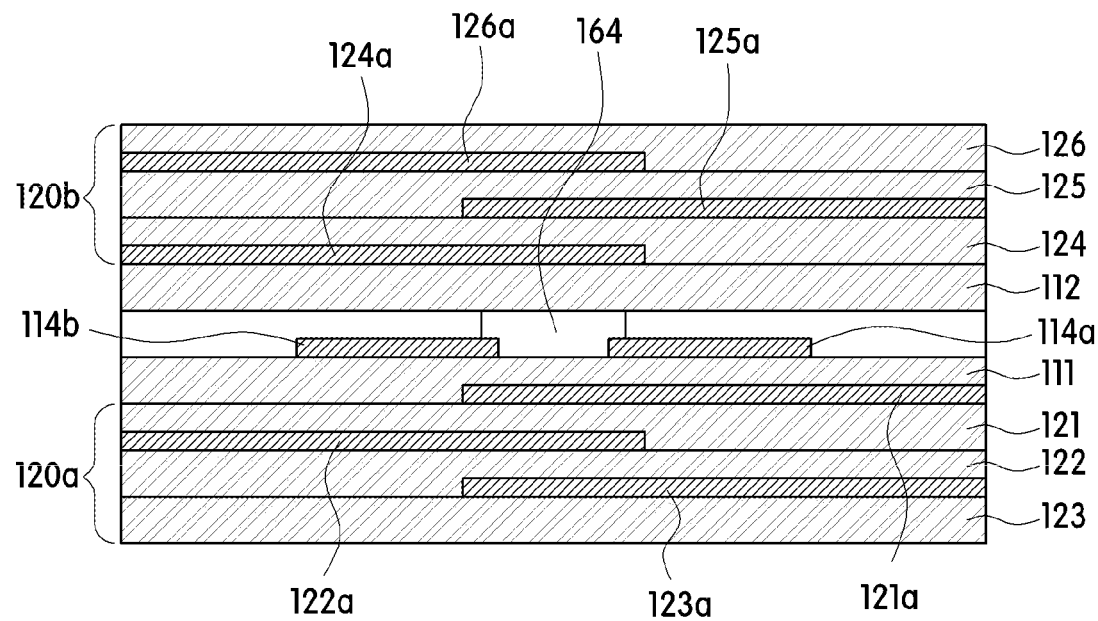
FIG. 14 is a cross-sectional view illustrating another example of an electric shock protection unit according to an embodiment of the present invention.

As another embodiment, as shown in FIG. 14, the electric shock protection device 200 may include the pair of inner electrodes 114a and 114b disposed horizontally spaced a predetermined interval apart from each other. That is, inner electrodes 114a and 114b are spaced apart from each other to form a pore inside at least one pair of sheet layers 111 and 112. Preferably, the pair of inner electrodes 114a and 114b are spaced a predetermined interval apart from each other in a parallel direction on the same plane.

Herein, a pore 164 may be formed between the pair of inner electrodes 114a and 114a. Herein, the pore 164 may be formed at a higher height than the pair of inner electrodes 114a and 114b and may be formed with a width that is greater than an interval of the pair of inner electrodes 114a and 114b. In such a way, when the volume of the pore 164 is expanded, even when fine particles occur from the inner electrodes 114a and 114b during discharging, since a space between the inner electrodes 114a and 114b is broad, it may reduce the incidence of defects that can be caused by particles. At this point, the pore is a space where discharging starts by the pair of inner electrodes 114a and 114b when static electricity flows and the volume of the pore may be set to satisfy the resistance to static electricity. For example, the volume of the pore may be 1% to 15% with respect to the total volume of the electric shock protection device 100. Herein, when the volume of the pore is less than 1% with respect to the total volume of the electric shock protection device 200, short may occur between the pair of inner electrodes 214a and 214b and the resistance to static electricity may be deteriorated. Additionally, when the volume of the pore is greater than 15% with respect to the total volume of the electric shock protection device 200, the entire volume of the electric shock protection device 200 is increased and mechanical strength is lowered, so that warpage or dent may occur by deformation during a firing process.

More specifically, the pair of inner electrodes 114a and 114b are arranged spaced apart from each other to form a gap at the upper surface of the first sheet layer 111. Herein, a gap between the pair of inner electrodes 114a and 114a may be 10 μm to 100 μm. Such the pair of inner electrodes 114a and 114b are pattern-printed on the top surface of the first sheet layer 111.

At this point, a pore 164 for blocking static electricity, protecting an electric shock protection device and peripheral circuits from overvoltage, and cutting off leakage current is provided between the pair of electrodes 114a and 114b corresponding to each other in order to.

The pore 164 is disposed between the pair of inner electrodes 114a and 114b arranged in parallel to each other on the same plane and is provided in a hollow form to be filled with air, and the second sheet layer 112 is stacked on the open upper part of the pore 164.

The pore 164 is provided in plurality and may be arranged spaced apart from each other along the width direction of the inner electrodes 114a and 114b. In such a way, if the number of pores 164 is increased, as a discharge path of static electricity is increased, the resistance to static electricity can be improved.

At this point, the pore 164 is formed to have a height that exceeds the height from the top surface of the first sheet layer 111 to the upper end of the inner electrodes 114a and 114b. That is, the pore 164 according to an embodiment of the present invention is provided to have a height that exceeds the entire height of the inner electrodes 114a and 114b so that the volume of the entire pore 164 may be enlarged.

Through this, when fine particles occur from the inner electrodes 114a and 114b during discharging of static electricity, it may reduce the incidence of defects that can be caused by particles through the pore 164 having a broad space.

At this point, the pore 164 may be provided to extend toward the top surface or the bottom surface of the pair of inner electrodes 114a and 114b spaced apart from each other.

Furthermore, the pore 164 may be provided with the same width as the pair of inner electrodes 114a and 114b and at this point, the pore 164 may be provided to thicker than the thickness of the pair of inner electrodes 114a and 114b.

After a pore material is pattern-printed between the pair of inner electrodes 114a and 114b, as the pore material is removed by a heat applied during a firing process, the pore 164 is formed. Herein, the pore material is used to prevent the pore 164 from being deformed or damaged by pressure during a compression process for forming a sintered body after a first sheet layer 111 and a second sheet layer 112 are stacked.

For this, as the pore material is formed of a material that is decomposed by a high temperature heat, it may be removed during a firing process after a plurality of sheet layers are stacked. As one example, the pore material may be formed of a material decompressed in a temperature range of 200° C. to 2000° C.

At this point, the pair of inner electrodes 114a and 114b may be provided in various forms and patterns or may be provided in the same pattern or in different patterns.

For example, the inner electrodes 114a and 114b disposed facing each other may be provided in polygonal form, circular form, elliptical form, spiral form, and various forms and patterns obtained by combining them. Then, inner electrodes facing each other may be provided in the same pattern and form or may be provided in different patterns and forms.

For example, the pair of inner electrodes 114a and 114b may be provided in a bar form having a rectangular section and the end part may be provided in an about 'Y' form having an edge of a rectangular section.

Additionally, in relation to the pair of inner electrodes 114a and 114b, an end part may be provided in a bar form with an arc form or an end part may be provided in an about 'Y' form with an arc form.

However, the section of the electrode is not limited to the above and it should be clarified that the above-mentioned four forms may be provided in the mutually combined form and end parts facing each other may be provided in circular form, polygonal form, wave form, and combinations thereof.

On the other hand, in relation to the pair of inner electrodes 114a and 114b, gaps spaced a predetermined interval apart from each other are formed between end parts facing each other and the pore 164 is provided around the center of the gap. At this point, a discharging material layer applied at a predetermined thickness according to a height direction of the inner electrodes 114a and 114b is provided to the inner wall of the pore 164. At this point, it should be clarified that the discharging material layer may be provided at only the inner wall of the pore 164 but may be applied to cover an open upper part of the pore 164. That is, the discharging material layer may extend by connecting the open upper ends of the pore 164 in addition to the inner wall of the pore 164.

On the other hand, in relation to the first sheet layer 111 and the second sheet layer 112 configuring the sintered body, the second sheet layer 112 may be directly stacked on the first sheet layer 111 but an additional buffer layer corresponding to the height of the pair of inner electrodes 114a and 114b formed at the top surface of the first sheet layer 111 and the pore 164 may be stacked. Such a buffer layer may perform a role for removing a height difference corresponding to the height of the inner electrodes 114a and 114b and the height of the pore 164.

Figure 15A:
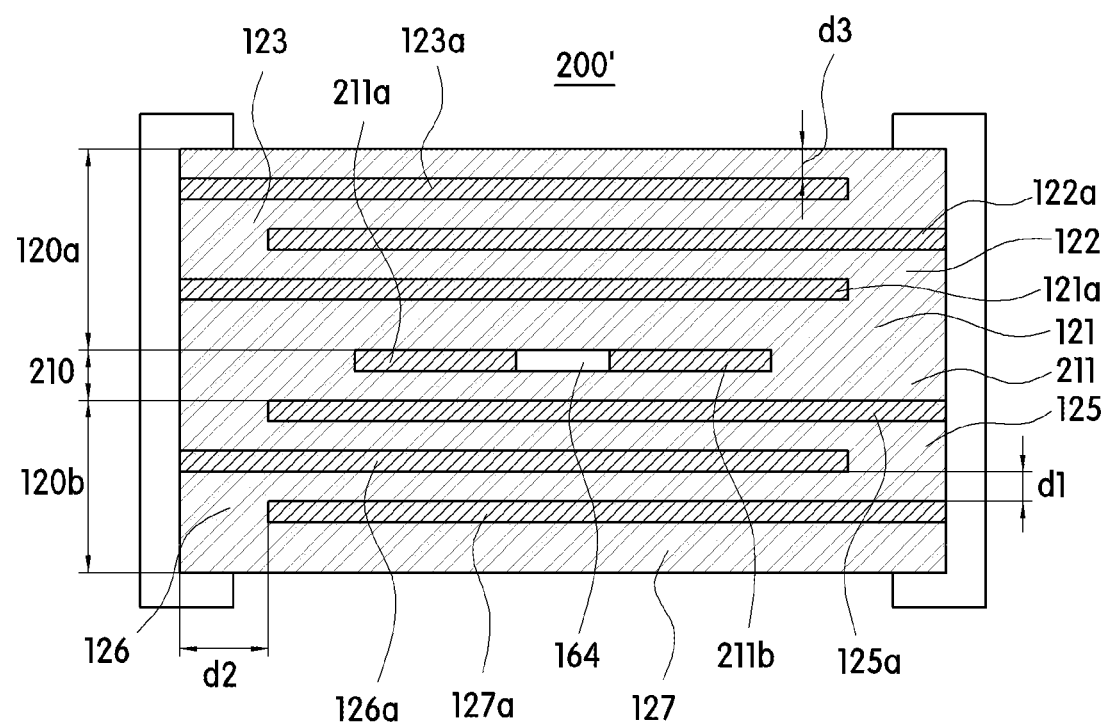
FIGS. 15A to 15C are cross-sectional views illustrating a variety of forms of a pore in an electric shock protection device according to another embodiment of the present invention.
Figure 15B:
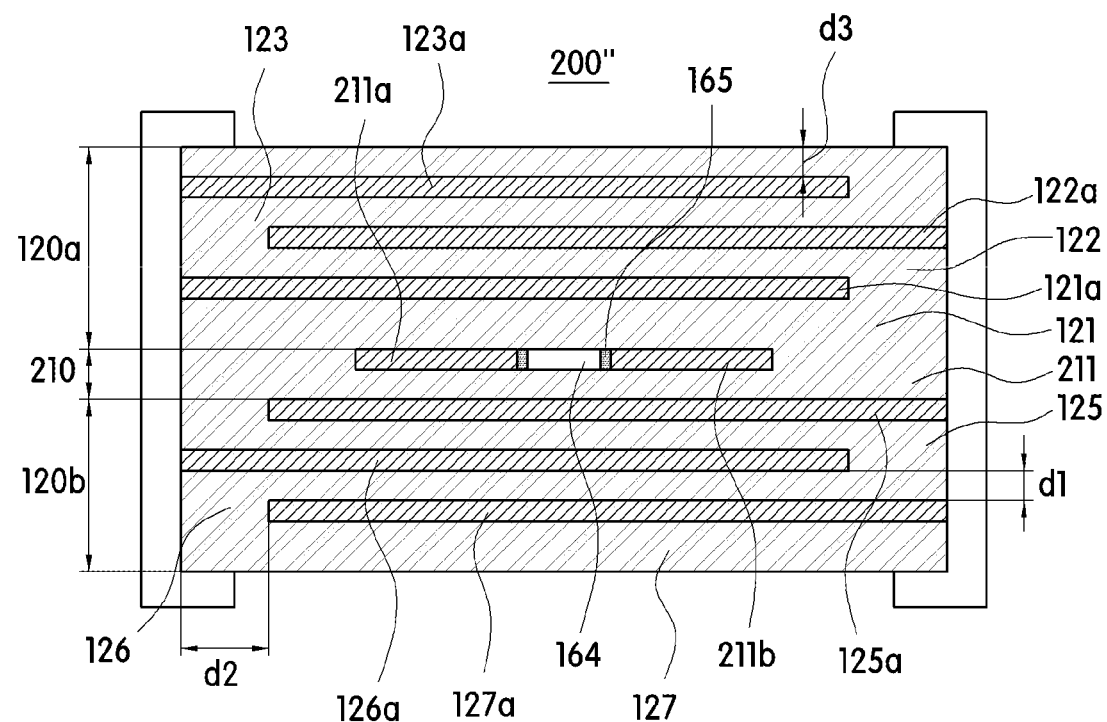
Figure 15C:
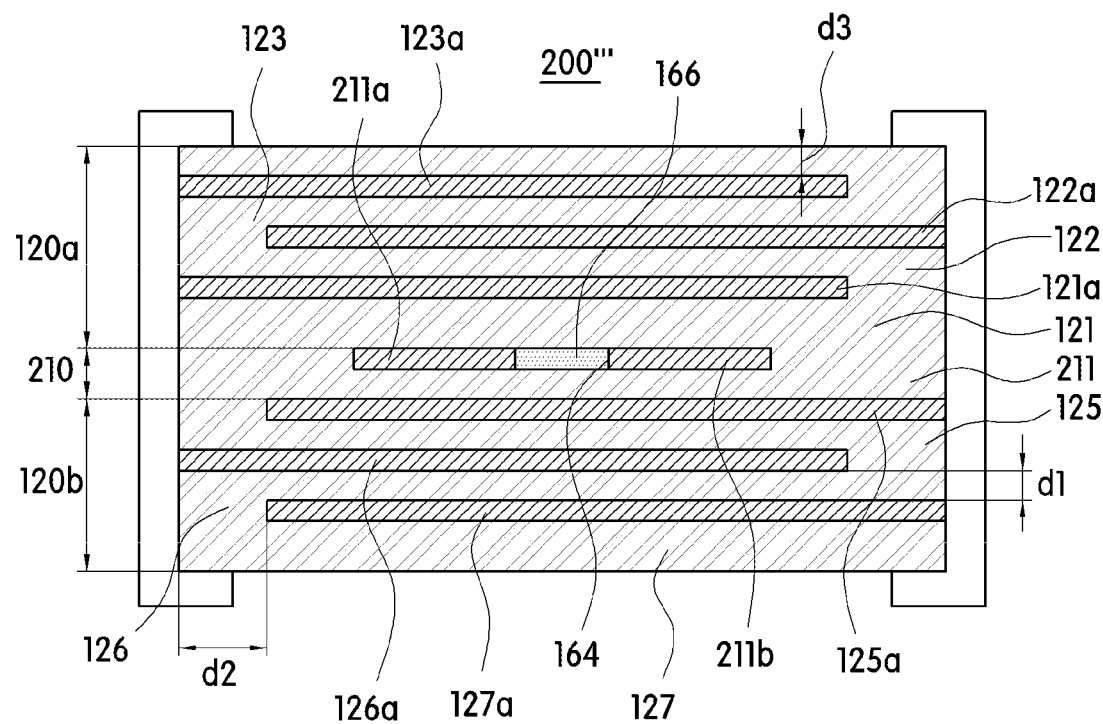

As another embodiment, as shown in FIGS. 15A to 15C, in relation to the electric shock protection devices 200', 200", and 200''', the pair of inner electrodes 211a and 211b are disposed spaced apart from each other to form a gap on the same plane of the protective sheet layer 211 and the through hole 164 is provided at a pore formed between the pair of inner electrodes.

That is, the through hole 164 is disposed between the pair of inner electrodes 211a and 211b arranged in parallel to each other on the same plane and is provided in a hollow form to be filled with air.

One the other hand, when the first inner electrode 211a and the second inner electrode 211b configuring the electric shock protection unit 210 are arranged spaced a predetermined interval from each other on the same plane of the protective sheet layer 211, the first inner electrode 211a and the second inner electrode 211b may be also provided in various forms and patterns.

That is, in relation to the electric shock protection device 200", as shown in FIG. 15B, the electric shock protection unit 210 may include a discharging material layer 165 applied to the inner wall of the through hole 164 at a predetermined thickness along a height direction.

Additionally, in relation to the electric shock protection device 200''', as shown in FIG. 15C, the through hole 164 of the electric shock protection unit 210 may be filled with a filling material 166.

By such a configuration, the electric shock protection device may provide a variety of capacitances appropriate for communication signals in wireless communication band corresponding to the intended purpose.

In relation to an electric shock protection device and a portable electronic device including the same according to an embodiment of the present invention, with an electric shock protection device connecting a conductor and a circuit unit in a portable electronic device where the conductor such as a metal case is exposed to the outside, a user and an internal circuit are protected from leakage current and static electricity by external power source and a high capacitance is implemented so that communication signals are delivered with minimal attenuation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electric shock protection device disposed between a human body contactable conductor and an internal circuit unit of an electronic device, the electric shock protection device comprising:
    a sintered body where a plurality of sheet layers are stacked;
    an electric shock protection unit including at least one pair of inner electrodes disposed spaced a predetermined interval apart from each other inside the sintered body, having one end connected the human body contactable conductor and the other end connected internal circuit unit of an electronic device, and configured to pass static electricity without causing dielectric breakdown when the static electricity flows from the conductor, and to block a leakage current of an external power source flowing from a ground of the circuit unit; and
    at least one capacitor layer connected in parallel to the electric shock protection unit and configured to pass communication signals flowing from the conductor,
    wherein at least part of the plurality of sheet layers is formed of a first ceramic material;
    the remaining sheet layers are formed of a second ceramic material;
    the first ceramic material and the second ceramic material are different kinds of ceramic materials; and
    the ceramic material is a metal-oxide compound comprising at least one selected from $Er_2O_3$, $Dy_2O_3$, $Ho_2O_3$, $V_2O_5$, $CoO$, $MoO_3$, $SnO_2$, $BaTiO_3$, and $Nd_2O_3$, or Low Temperature Co-fired Ceramics (LTCC) or High Temperature Co-fired Ceramics (HTCC), or ferrite.

2. The electric shock protection device of claim 1, wherein the following equation is satisfied for the electric shock protection unit, $$Vbr > Vin$$

where Vbr is a breakdown voltage of the electric shock protection unit and Vin is a rated voltage of an external power source of the electronic device.

3. The electric shock protection device of claim 2, wherein the following equation is satisfied for the electric shock protection unit and the capacitor layer, $$Vcp > Vbr$$

where Vbr is a breakdown voltage of the electric shock protection unit and Vcp is a dielectric breakdown voltage of the capacitor layer.

4. The electric shock protection device of claim 1, wherein the following equation is satisfied for the electric shock protection unit and the capacitor layer, $$Vcp > Vbr$$

where Vbr is a breakdown voltage of the electric shock protection unit and Vcp is a dielectric breakdown voltage of the capacitor layer.

5. The electric shock protection device of claim 1, wherein the electric shock protection unit comprises a pore formed between at least one pair of inner electrodes.

6. The electric shock protection device of claim 5, wherein the pore has a width that is equal to or greater than an interval between the pair of inner electrodes and a height that is equal or greater than a thickness of the pair of inner electrodes.

7. The electric shock protection device of claim 5, wherein the pore includes a discharging material layer.

8. The electric shock protection device of claim 7, wherein the discharging material layer is formed of a non-conductive material including metal particles or a semiconductor material.

9. The electric shock protection device of claim 5, wherein a volume of the pore is 1% to 15% with respect to a total volume of the electric shock protection device.

10. The electric shock protection device of claim 1, wherein an interval between the capacitor layer and the electric shock protection unit is greater than an interval between the pair of inner electrodes of the electric shock protection unit.

11. The electric shock protection device of claim 1, wherein an interval between the capacitor layer and the electric shock protection unit is 15 µm to 100 µm.

12. The electric shock protection device of claim 1, wherein a thickness of a capacitor electrode of the capacitor layer is 2 µm to 10 µm.

13. The electric shock protection device of claim 1, wherein an interval between capacitor electrodes of the capacitor layer is 15 µm to 100 µm.

14. The electric shock protection device of claim 1, wherein the pair of inner electrodes are disposed on the same plane or disposed vertically to face each other.

15. The electric shock protection device of claim 1, wherein the inner electrode comprises at least one component of Ag, Au, Pt, Pd, Ni, or Cu.

16. The electric shock protection device of claim 1, wherein an interval of the inner electrodes is 10 µm to 100 µm.

17. The electric shock protection device of claim 1, wherein a thickness of the inner electrodes is 2 µm to 10 µm.

18. A portable electronic device with an electric shock protection function, the portable electronic device comprising:
   a human body contactable conductor;
   a circuit unit; and
   an electric shock protection device of claim 1 disposed between the conductor and the circuit unit.

19. The portable electronic device of claim 18, wherein the conductor comprises at least one of an antenna for communication between the electronic device and an external device, a metal case, and a conductive jewelry.

20. The portable electronic device of claim 19, wherein the metal case is provided to partially or entirely surround a side part of a housing of the electronic device.

21. The portable electronic device of claim 19, wherein the metal case is provided to surround a camera that is provided at a front or rear surface of a housing of the electronic device to be exposed to the outside.

22. An electric shock protection device disposed between a human body contactable conductor and an internal circuit unit of an electronic device, the electric shock protection device comprising:
   an electric shock protection unit including at least one pair of inner electrodes disposed spaced a predetermined interval apart from each other inside a sintered body where a plurality of sheet layers stacked and a discharging material layer disposed between the inner electrodes, having one end connected the human body contactable conductor and the other end connected internal circuit unit of an electronic device, and configured to pass static electricity without causing dielectric breakdown when the static electricity flows from the conductor, and to block a leakage current of an external power source flowing from a ground of the circuit unit; and
   one pair of capacitor layer comprising a plurality of capacitor electrodes disposed spaced a predetermined interval apart from each other inside the sintered body, connected in parallel to both ends of the electric shock protection unit and configured to pass communication signals flowing from the conductor,
   wherein
      the electric shock protection unit is disposed between the pair of capacitor layers;
      an interval between the capacitor layer and the electric shock protection unit which is an interval between the nearest capacitor electrodes and the pair of inner electrodes is 15 µm to 100 µm;
      an interval between the pair of inner electrodes is 15 µm to 100 µm;
      a thickness of the pair of inner electrodes is 2 µm to 10 µm;
      a thickness of capacitor electrodes is 2 µm to 10 µm;
      at least part of the plurality of sheet layers is formed of a first ceramic material;
      the remaining sheet layers are formed of a second ceramic material;
      the first ceramic material and the second ceramic material are different kinds of ceramic materials; and
      the ceramic material is a metal-oxide compound comprising at least one selected from $Er_2O_3$, $Dy_2O_3$, $Ho_2O_3$, $V_2O_5$, $CoO$, $MoO_3$, $SnO_2$, $BaTiO_3$, and $Nd_2O_3$ or Low Temperature Co-fired Ceramics (LTCC) or High Temperature Co-fired Ceramics (HTCC), or ferrite.

23. The electric shock protection device of claim 22, wherein the discharging material layer is disposed in a pore formed between the pair of inner electrodes.

* * * * *